United States Patent [19]
Ikeda et al.

[11] Patent Number: 5,471,083
[45] Date of Patent: Nov. 28, 1995

[54] SEMICONDUCTOR DEVICE INCLUDING A FIELD EFFECT TRANSISTOR AND A BIPOLAR TRANSISTOR AND A METHOD OF MANUFACTURING THE SAME

[75] Inventors: Tatsuhiko Ikeda, Hyogo; Kazuhito Niwano, Kanagawa, both of Japan

[73] Assignee: Mitsubishi Denki Kabushiki Kaisha, Tokyo, Japan

[21] Appl. No.: 304,898

[22] Filed: Sep. 13, 1994

[30] Foreign Application Priority Data

Dec. 16, 1993 [JP] Japan .................... 5-316769

[51] Int. Cl.[6] .................... H01L 23/48; H01L 29/44; H01L 29/52; H01L 29/78
[52] U.S. Cl. .................... 257/370; 257/369
[58] Field of Search .................... 257/370, 369, 257/371, 378

[56] References Cited

U.S. PATENT DOCUMENTS 5,311,078  5/1994  Makino et al. .................... 257/370

FOREIGN PATENT DOCUMENTS 64-37860   2/1989  Japan .
2-101771   4/1990  Japan .
3-149871   6/1991  Japan .

OTHER PUBLICATIONS

Muller et al, *Device Elec for IC's . . .*, 1986, pp. 456–457.

*Primary Examiner*—Stephen D. Meier
*Attorney, Agent, or Firm*—Lowe, Price, LeBlanc & Becker

[57] ABSTRACT

Disclosed is a semiconductor device including a bipolar transistor and a field effect transistor and allowing an increased operating speed, and a method of manufacturing such a semiconductor device. In the semiconductor device, a junction depth of an intrinsic base layer and a junction depth of an external base layer are made shallower than a junction depth of source/drain regions. Whereby a parasitic capacitance of the bipolar transistor portion is reduced, and at the same time, a driving current of the field effect transistor portion is increased to some extent. Consequently, an increased operating speed of the bipolar transistor portion and the field effect transistor portion is achieved.

10 Claims, 24 Drawing Sheets

SEMICONDUCTOR DEVICE INCLUDING A FIELD EFFECT TRANSISTOR AND A BIPOLAR TRANSISTOR AND A METHOD OF MANUFACTURING THE SAME

BACKGROUND OF THE INVENTION

1. Field of the Invention

The present invention relates to a semiconductor device and a method of manufacturing the same, and more particularly, it is concerned with a semiconductor device including a field effect transistor and a bipolar transistor and a method of manufacturing such a semiconductor device.

2. Description of the Background Art

Conventionally, a BiCMOS element has been known as an element which allows high speed operation of a bipolar element, and high integration and low power consumption of a CMOS element.

FIG. 35 is a sectional view showing a semiconductor device having a conventional BiCMOS element. Referring to FIG. 35, in the semiconductor device including the conventional BiCMOS elements a P channel MOS transistor, an N channel MOS transistor, and an NPN bipolar transistor are formed adjacent to each other on a p⁻ type semiconductor substrate 101.

In the P channel MOS transistor region, an n⁺ buried layer 102a is formed on p type semiconductor substrate 101. An n⁻ layer 103b is formed on n⁺ buried layer 102a. p type source/drain regions 120a and 120b are formed apart a predetermined distance from each other so as to sandwich a channel region on a main surface of n⁻ layer 103b. A polycrystalline silicon layer 111 is formed on the channel region with a gate oxide film 110 interposed therebetween. A tungsten silicide layer 112 is formed on polycrystalline silicon 111. Polycrystalline silicon layer 111 together with tungsten silicide layer 112 forms a gate electrode. A sidewall insulating film 113 is formed on both sides of polycrystalline silicon layer 111 and tungsten silicide layer 112. Thus, the P channel MOS transistor is formed of source/drain regions 120a, 120b, polycrystalline silicon layer 111 and tungsten silicide layer 112.

In the N channel MOS transistor region, a p⁺ layer 102b is formed on p type semiconductor substrate 101. A p⁻ layer 104 is formed on p⁺ layer 102b. High concentration source/drain regions 108a and 108b are formed apart a predetermined distance from each other so as to sandwich a channel region on a main surface of p⁻ layer 104. Low concentration source/drain regions 109a and 109b are respectively formed on the channel region side of high concentration source/drain regions 108a and 108b. The source/drain regions of a LDD (Lightly Doped Drain) structure are formed of those high concentration source/drain regions 108a, 108b and those low concentration source/drain regions 109a, 109b.

In the NPN bipolar transistor region, n⁺ buried layer 102a is formed on p type semiconductor substrate 101. An n⁻ collector layer 103a is formed on n⁺ buried layer 102a. An n⁺ collector extraction layer 105 is formed continuously with n⁻ collector layer 103a. External base layer 114 is formed on a main surface of n⁻ collector layer 103a. An intrinsic base layer 115 is formed surrounded by external base layer 114. An emitter layer 116 is formed on a main surface of intrinsic base layer 115. A base extraction electrode layer 117 is formed electrically connected to external base layer 114. An insulating film 118 is formed on base extraction electrode layer 117. Sidewall insulating film 113 is formed on both sides of base extraction electrode layer 117 and insulating film 118. An emitter electrode layer 119 is formed electrically in connection with emitter layer 116.

In a boundary region between the NPN bipolar transistor region and the N channel MOS transistor formed an element isolation insulating film 107. An isolation layer 106 is formed under element isolation insulating film 107. Also, element isolation insulating film 107 is formed in the boundary region between the N channel MOS transistor and the P channel MOS transistor. Element isolation insulating film 107 is also formed between external base layer 114 and n⁺ collector extraction layer 105 in the NPN bipolar transistor region.

FIGS. 36–45 are sectional views showing a manufacturing process of the semiconductor device having the conventional BiCMOS element shown in FIG. 35. Referring to FIGS. 36–45, description will be made on the manufacturing process of the conventional semiconductor device.

First, n⁺ buried layer 102a and p⁺ buried layer 102b are formed on p type semiconductor substrate 101, (see FIG. 35). n⁻ collector layer 103a is formed on n⁺ buried layer 102a in the NPN bipolar transistor region. At the same time, n⁻ layer 103b is formed on n⁺ buried layer 102a in the P channel MOS transistor. p⁻ layer 104 is formed on p⁺ buried layer 102b. Then, as shown in FIG. 36, isolation layer 106 is formed in the boundary region between the NPN bipolar transistor and the N channel MOS transistor. Also, element isolation insulating film 107 is formed by the LOCOS (Local Oxidation of Silicon) method in the boundary region between the P channel MOS transistor and the N channel MOS transistor, between the N channel MOS transistor and NPN bipolar transistor, respectively, and in a predetermined region on n⁻ layer 103a in the NPN bipolar transistor region. After that, gate oxide film 110 is formed on the entire surface, and then the gate oxide film in the NPN bipolar transistor region (not shown) is removed.

A p type polycrystalline silicon layer 117 having p type impurity doped thereinto is formed on the entire surface by the CVD method to have a thickness of about 2000 Å. Insulating film 118 is formed on p type polycrystalline silicon layer 117 by the CVD method to have a thickness of about 3000 Å. A resist 130 is formed at a predetermined region oil insulating film 118. Insulating film 118 and p type polycrystalline silicon film 117 are etched anisotropically using resist 130 as a mask. Whereby base extraction electrode layer 117, made of p type polycrystalline silicon film, and insulating film 118 are formed as shown in FIG. 37. Then, resist 130 is removed. After that, heat treatment is carried out such that p type impurity is thermally diffused from base extraction electrode layer (p type polycrystalline silicon layer) 117 toward n⁻ collector layer 103a, thereby forming external base layer 114.

Next, as shown in FIG. 38, a thin oxide film 132 having a thickness of about 200 Å is formed in the NPN bipolar transistor region. n type polycrystalline silicon layer 111 is formed on the entire surface by the CVD method to have a thickness of about 2000 Å. Tungsten silicide layer 112 is formed on N type polycrystalline silicon layer 111 to have a thickness of about 2000 Å. A resist 131 is formed at a predetermined region on tungsten silicide layer 112. Then, tungsten silicide layer 112 and N type polycrystalline silicon layer 111 are etched anisotropically using resist 131 as a mask. Whereby a patterned N type polycrystalline silicon layer 111 and tungsten silicide layer 112 are formed as shown in FIG. 39. The N type polycrystalline silicon layer 112 together with tungsten silicide layer 112 serves as a gate electrode. Then, resist 131 is removed.

Next, a resist 133 is formed to cover portions other than the NPN bipolar transistor region. p type impurity is ion-implanted into the region serving as the intrinsic base layer of the NPN transistor using resist 133 as a mask. Resist 133 is then removed.

After that, as shown in FIG. 41, a resist 134 is formed to cover portions other than the N channel MOS transistor region. n type impurity is ion-implanted into the N channel MOS transistor region using resist 134 as a mask. Resist 134 is then removed.

After formation of the insulating film on the entire surface, anisotropic etching is carried out to form sidewall insulating film 113 as shown in FIG. 42.

Next, a resist 135 is formed to cover regions other than the N channel MOS transistor region. n type impurity is ion-implanted at a high concentration into the N channel MOS transistor region using resist 135 as a mask. Resist 135 is then removed.

As shown in FIG. 44, a resist 136 is formed to cover regions other than the P channel MOS transistor region. p type impurity is ion-implanted into the P channel MOS transistor region. Resist 136 is then removed. Then, heat treatment is conducted to electrically activate the ion-implanted impurity. Thus, as shown in FIG. 45, intrinsic base layer 115, high concentration source/drain regions 108a, 108b, low concentration source/drain regions 109a, 109b, and source/drain regions 120a, 120b are formed.

After that, emitter electrode 119 made of the N type polycrystalline silicon including N type impurity is formed as shown in FIG. 35. Heat treatment is conducted to diffuse n type impurity from emitter electrode 119 toward intrinsic base layer 115, thus forming emitter layer 116. Consequently, the semiconductor device including the conventional BiCMOS element is formed.

In the manufacturing method of the above-described conventional semiconductor device, gate oxide film 110 is damaged during anisotropic etching of insulating film 118 and P type polycrystalline silicon layer 117 (see FIGS. 36–37). Therefore, when the N channel MOS transistor and the P channel MOS transistor are formed, a leak current tends to be flown to the channel region from the gate electrode through gate oxide film 110. As a result, the electrical characteristic of the N channel and the P channel MOS transistors is deteriorated.

Further, in the method of manufacturing the conventional semiconductor device, external base layer 114 is formed by heat treatment in the step shown in FIG. 37, and then heat treatment is again carried out in the step shown in FIG. 45 to form intrinsic base layer 115, high concentration source/drain regions 108a, 108b, low concentration source/drain regions 109a, 109b, and source/drain regions 120a, 120b. At this time, external base layer 114 is also affected by the heat treatment for forming intrinsic base layer 115 and the like shown in FIG. 45. As a result, external base layer 114 is further diffused to deepen its junction depth. As the depths of external base layer 114 becomes deeper, the junction area between the external base and the collector becomes larger, whereby the junction capacitance between the external base and the collector increases. Also, as the depths of external base layer 114 becomes deeper, the distance between external base layer 114 (see FIG. 35) and n$^+$ buried layer 102a becomes narrower, whereby the capacitance between the external base and n buried layer increases. Consequently, the parasitic capacitance increases because of the increased junction capacitance between the external base and the collector and the increased capacitance between the external base and n$^+$ buried layer. The increased parasitic capacitance causes reduction of the operating speed of the NPN bipolar transistor.

SUMMARY OF THE INVENTION

An object of the present invention is to effectively prevent reduction of the operating speed of a bipolar transistor portion in a semiconductor device.

Another object of the present invention is to decrease a parasitic capacitance of a bipolar transistor portion in a semiconductor device.

Still another object of the present invention is to facilitate manufacturing of a semiconductor device having a small parasitic capacitance of a bipolar transistor portion in a method of manufacturing a semiconductor device.

A further object of the present invention is to facilitate manufacturing of a semiconductor device which allows reduction of a leak current from a gate electrode of a field effect transistor portion in a method of manufacturing a semiconductor device.

In one aspect of the present invention, a semiconductor device includes a field effect transistor and a bipolar transistor. The field effect transistor includes a semiconductor region of a first conductivity type having a main surface, a pair of source/drain regions of a second conductivity type, and a gate electrode. The source/drain regions having a first junction depth are formed apart a predetermined distance from each other so as to define a channel region on the main surface of the semiconductor region. The gate electrode is formed on the channel region. The bipolar transistor includes a collector layer of a first conductivity type, an external base layer of the second conductivity type, an intrinsic base layer of the second conductivity type, and an emitter layer of the first conductivity type. The external base layer having a second junction depth shallower than the first junction depth is formed at a predetermined region on the main surface of the collector layer. The intrinsic base layer having a third junction depth shallower than the first junction depth is formed continuously with the external base layer on the main surface of the collector layer. The emitter layer is formed on the main surface of the intrinsic base layer. Preferably, the third junction depth is shallower than the second junction depth. Preferably, a buried layer of the second conductivity type is further formed under and in contact with and the intrinsic base layer.

In the semiconductor device, since the second junction depth of the external base layer and the third junction depth of the intrinsic base layer of the bipolar transistor portion are both made shallower than the first junction depth of the source/drain regions of the field effect transistor, the junction area between the external base and the collector is made smaller than before and the distance between the external base layer and the buried collector layer are increased. As a result, the junction capacitance between the external base and the collector and the capacitance between the external base and the buried collector are reduced, thus reducing the parasitic capacitance of the bipolar transistor. Therefore, the operating speed of the bipolar transistor is increased. On the other hand, since the first junction depth of the source/drain regions is made deeper than the second junction depth of the external base layer and than the third junction depth of the intrinsic base layer, the driving current of the field effect transistor increases. Therefore, the operating speed of the field effect transistor is also increased. Consequently, the increased operating speed of both the bipolar transistor and the field effect transistor greatly contributes to the increase of the operating speed of the semiconductor device as a whole. Also, the junction depth of the intrinsic base layer can be made further shallower if the buried layer of the first conductivity type is formed under the intrinsic base layer. Whereby thickness of the intrinsic base layer is made smaller and, therefore, carrier's transit time to go across the intrinsic base layer is reduced. As a result, high operation speed of the field effect transistor can be obtained.

In another aspect of the present invention, according to a method of manufacturing the semiconductor device, a gate electrode layer is formed on a region where a field effect transistor is formed with a gate insulating layer interposed therebetween. Impurity is ion-implanted into regions where source/drain regions of the field effect transistor are formed. After formation of the gate electrode layer, an external base electrode layer is formed on a region where an external base layer of a bipolar transistor is formed. Impurity is introduced into the external base electrode layer. Impurity is ion-implanted into a region where an intrinsic base layer of the bipolar transistor is formed. Heat treatment is carried out to electrically activate the impurity ion-implanted into the regions serving as source/drain regions and the impurity ion-implanted into the region serving as the intrinsic base layer, and then diffuse toward the region serving as the external base layer the impurity introduced into the external base electrode layer.

In the method of manufacturing the semiconductor device, since the external base electrode layer is formed, after formation of the gate electrode layer, on the region where the external base layer of the bipolar transistor is formed, the gate insulating film under the gate electrode layer is not damaged during patterning of the external base electrode layer. Whereby the leak current is prevented from flowing to the channel region through the gate insulating film from the gate electrode after completion of the field effect transistor. Also, heat treatment is carried out for electrically activating the impurity ion-implanted into the region serving as the source/drain regions and the impurity ion-implanted into the region serving as the intrinsic base layer, and for diffusing the impurity introduced into the external base electrode layer toward the region serving as the external base layer. Thus, the external base layer is not subjected to the heat treatment twice compared with the conventional case when only the external base layer is formed in advance. Consequently, the diffusion by heat of the external base layer is restrained and the external base layer having a shallow junction depth can be easily formed.

The foregoing and other objects, features, aspects and advantages of the present invention will become more present invention when taken in conjunction with the apparent from the following detailed description of the accompanying drawings.

DESCRIPTION OF THE PREFERRED EMBODIMENTS

Figure 1:
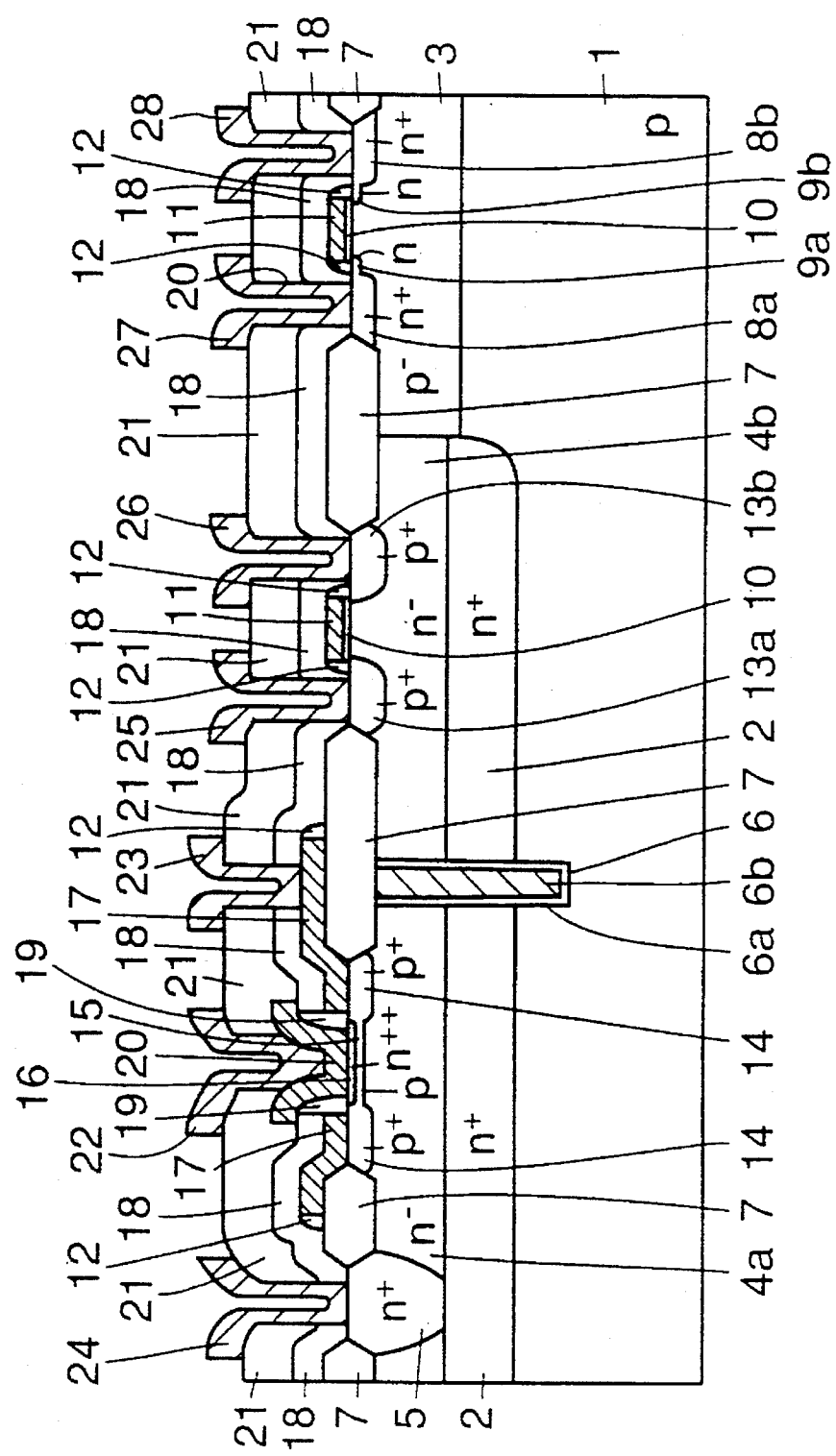
FIG. 1 is a sectional view showing a semiconductor device including a BiCMOS element according to a first embodiment of the present invention.

Embodiments of the present invention will be described below referring to the drawings.

Referring to FIG. 1, in a semiconductor device according to a first embodiment, an NPN bipolar transistor, a P channel MOS transistor and an N channel MOS transistor are formed adjacent to each other.

In the N channel MOS transistor region, a $p^-$ layer 3 is formed on a p type semiconductor substrate 1. High concentration source/drain regions 8a and 8b are formed apart a predetermined distance from each other so as to sandwich a channel region on a main surface of $p^-$ layer 3. Low concentration source/drain regions 9a and 9b are respectively formed on the channel region side of each of high concentration source/drain regions 8a and 8b. A gate electrode 11 made of a polycrystalline silicon film is formed to have a thickness of about 1000–3000 Å with a gate oxide film 10 having a thickness of about 80–200 Å interposed therebetween. A sidewall insulating film 12 is formed on both sides of gate electrode 11.

In the P channel MOS transistor region, an $n^+$ buried layer 2 is formed on p type semiconductor substrate 1. An $n^-$ layer 4b is formed on $n^+$ buried layer 2. p type source/drain regions 13a and 13b are formed apart a predetermined distance from each other so as to sandwich a channel region on a main surface of $n^-$ layer 4b. Gate electrode 11 is formed on the channel region with gate oxide film 10 interposed therebetween. Sidewall insulating film 12 is formed on both sides of gate electrode 11.

In the NPN bipolar transistor region, $n^+$ buried layer 2 is formed on p type semiconductor substrate 1. An $n^-$ collector layer 4a is formed on $n^+$ buried layer 2. An $n^+$ collector extraction layer 5 is formed adjacent to $n^-$ collector layer 4a. External base layer 14 is formed on a main surface of $n^-$ collector layer 4a. An intrinsic base layer 15 is formed surrounded by external base layer 14. An emitter layer 16 is formed on a main surface of intrinsic base layer 15. A base extraction electrode layer 17 made of a polycrystalline silicon film is formed to have a thickness of about 1000–3000 Å on the surfaces of external base layer 14. An insulating film 18 is formed to have a thickness of about 2000–4000 Å on base extraction electrode layer 17. A sidewall insulating film 19 is formed on the side surface of base extraction electrode layer 17 and insulating film 18. An emitter electrode layer 20 is formed so as to be electrically in contact with emitter layer 16 and to extend along the surface of sidewall insulating film 19.

An element isolation insulating film 7 is formed in each of the boundary regions between the N channel and the P channel MOS transistors, between the P channel MOS transistor and the NPN bipolar transistor, and between n⁻ collector layer 4a and n⁺ collector extraction layer 5 of the NPN bipolar transistor region, respectively. An element isolation trench 6 is formed under element isolation insulating film 7 located in the boundary region between the NPN bipolar transistor and the P channel MOS transistor. An insulating film 6a is formed along the surface of element isolation trench 6. A filling material 6b made of a polycrystalline silicon film or an insulating film is filled in a region surrounded by insulating film 6a. Insulating film 18 having a thickness of about 2000–4000 Å is formed to cover gate electrode 11 and element isolation insulating film 7. An interlayer insulating film 21 having a thickness of about 10,000 Å is formed to cover insulating film 18.

A plurality of contact holes are formed in the predetermined regions of interlayer insulating film 21. An emitter interconnection layer 22 is formed to electrically contact to emitter electrode layer 20 via one of those contact holes. A base interconnection layer 23 is formed to electrically contact to base extraction electrode layer 17 via another contact hole. A collector interconnection layer 24 is formed to electrically contact to n⁺ collector extraction layer 5 via another contact hole. Source/drain interconnection layers 25 and 26 are formed to electrically contact to source/drain regions 13a and 13b, respectively, via other contact holes. Further, source/drain interconnection layers 27 and 28 are formed to electrically contact to high concentration source/drain regions 8a and 8b, respectively, via other contact holes.

Figure 35:
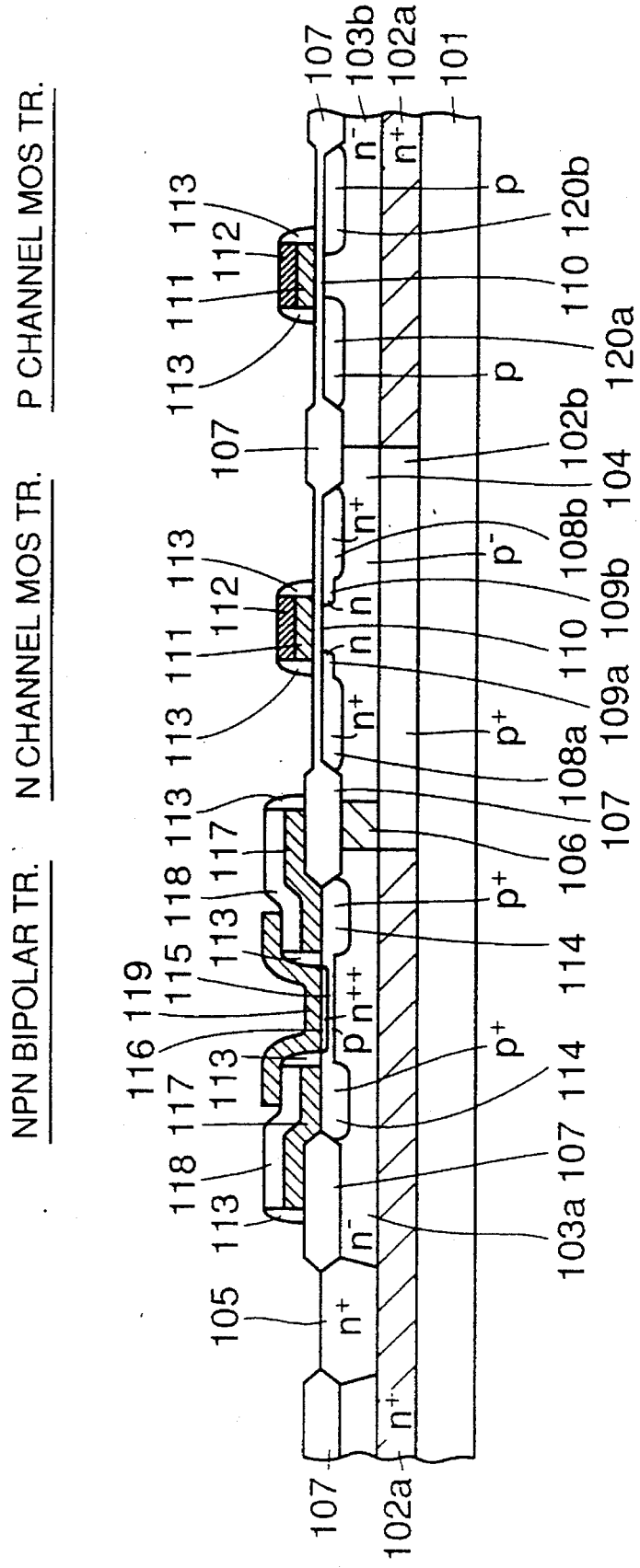
FIG. 35 is a sectional view showing a semiconductor device including a conventional BiCMOS element.
Figure 36:
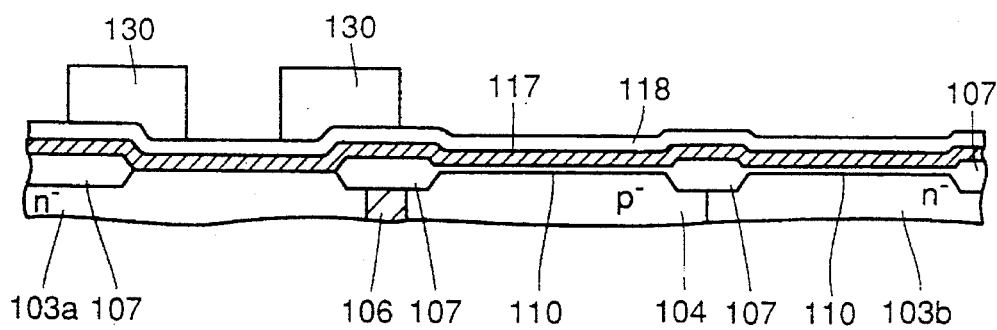
FIGS. 36–45 are sectional views showing 1st through 10th steps of a manufacturing process of the conventional semiconductor device shown in FIG. 35.
Figure 37:
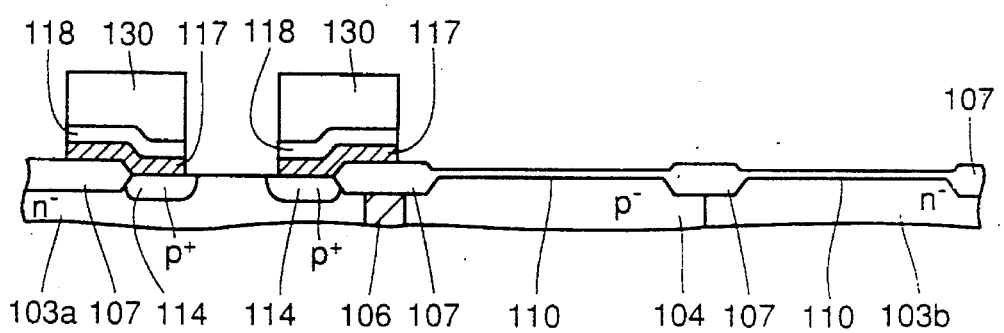
Figure 38:
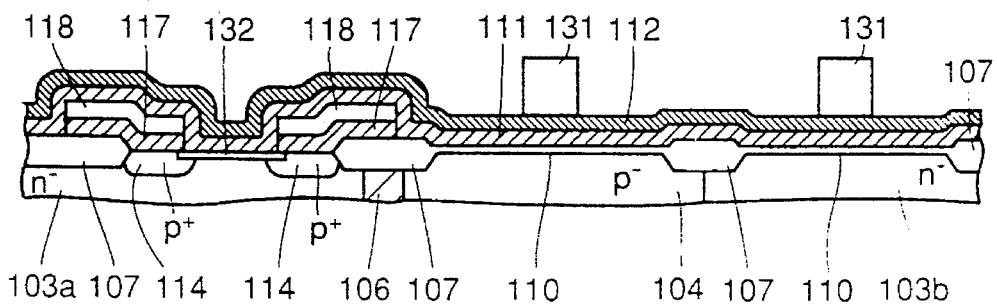
Figure 39:
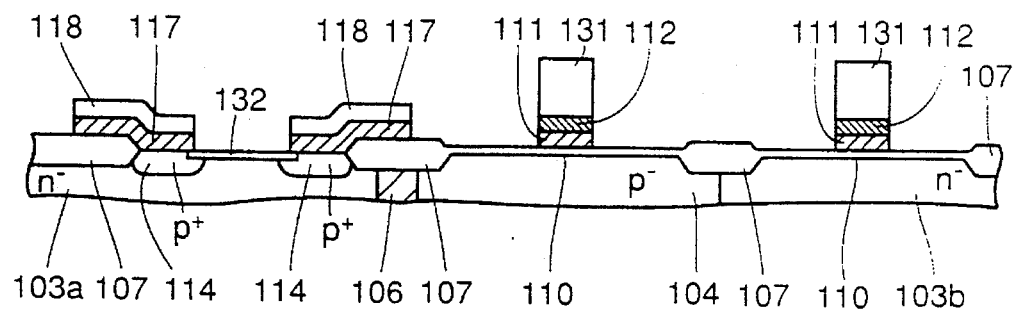
Figure 40:
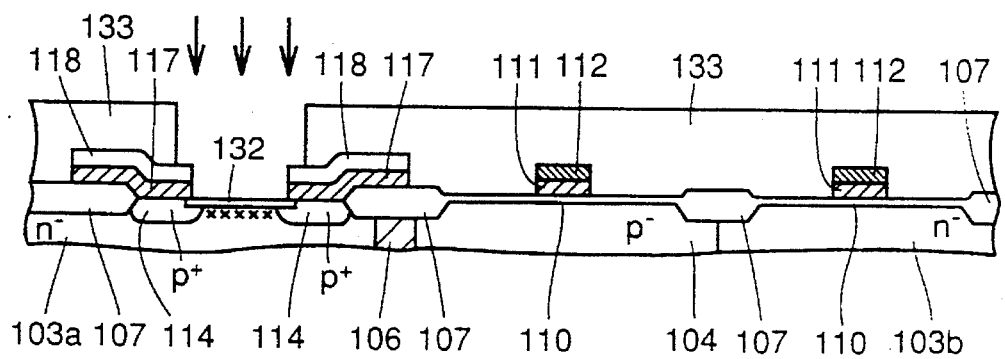
Figure 41:
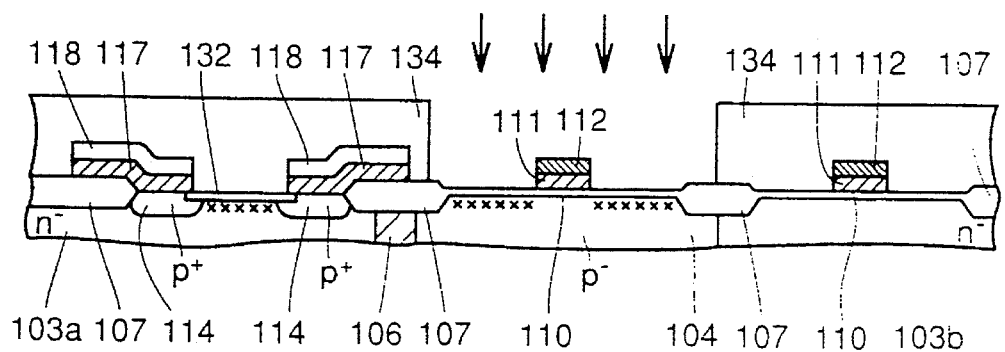
Figure 42:
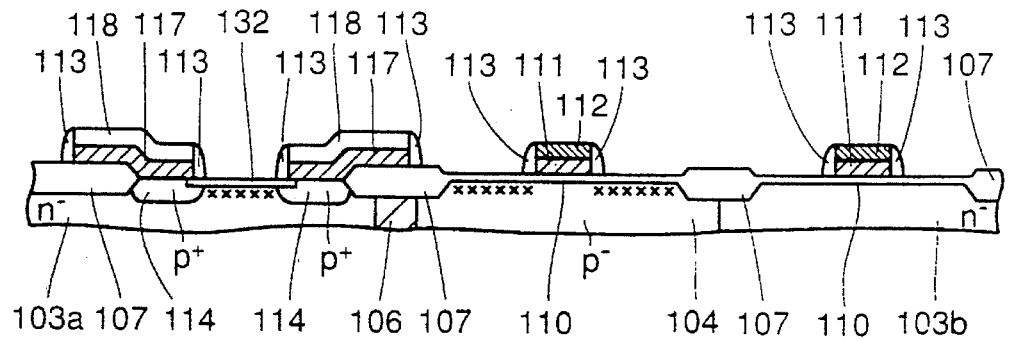
Figure 43:
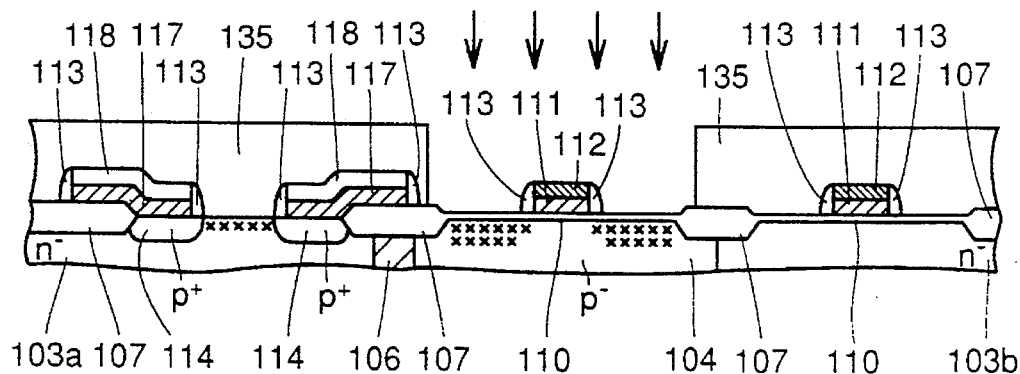
Figure 44:
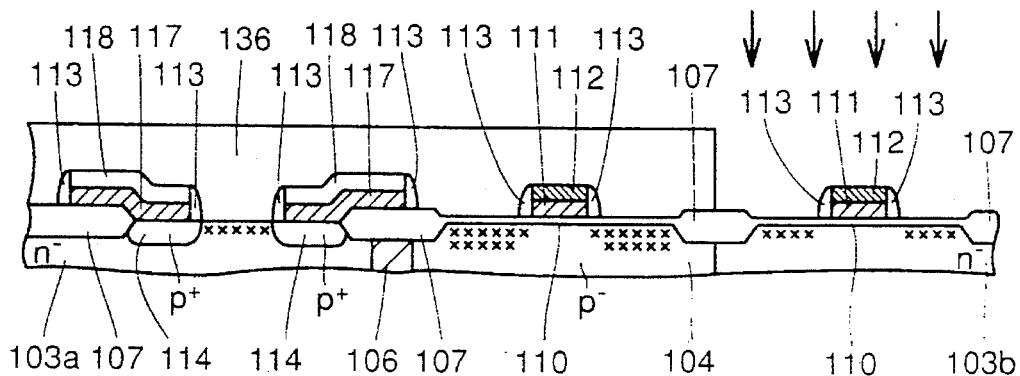
Figure 45:
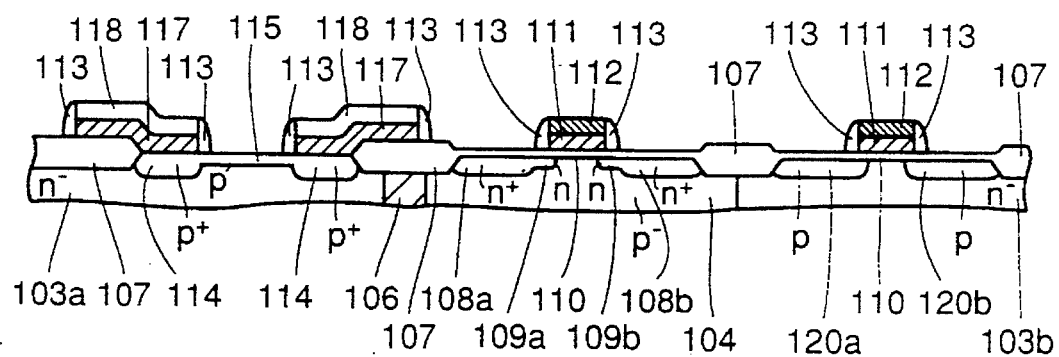

In the semiconductor device according to the first embodiment, the junction depths of external base layer 14 and intrinsic base layer 15 of the bipolar transistor are made shallower than the junction depth of source/drain regions 13a and 13b of the P channel MOS transistor. The junction depth of external base layers 15a, 15b is 2000 Å to 3000 Å (200 nm to 300 nm), the junction depth of the intrinsic base layer 15 is 1000 Å to 2000 Å (100 nm to 200 nm), and the junction depth of the source/drain regions 13a, 13b is 3000 Å to 5000 Å (300 nm to 500 nm). Thus, the junction area between the external base and the collector is made smaller compared with the conventional structure shown in FIG. 35, resulting in the decreased junction capacitance between the external base and the collector. At the same time, the distance between external base layer 14/intrinsic base layer 15 and n⁺ buried layer 2 is made wider. Thus, a width of a depletion layer located between external base layer 14/intrinsic base layer 15 and n⁺ buried layer 2 becomes wider, and the capacitance thereof becomes smaller. A parasitic capacitance of the bipolar transistor portion can be decreased due to the decreased junction capacitance between the external base and the collector and the decreased capacitance between external base layer 14/intrinsic base layer 15 and n⁺ buried layer 2. Consequently, the operating speed of the bipolar transistor portion can be improved compared with the conventional example.

On the other hand, the junction depth of source/drain regions 13a and 13b can be made deeper than the junction depth of intrinsic base layer 15 and external base layer 14, resulting in the increase of the driving current of the P channel MOS transistor. As a result, the operating speed of the P channel MOS transistor can be improved.

As described above, in the semiconductor device according to the first embodiment, the operating speed of both the NPN bipolar transistor and the P channel MOS transistor can be improved, so that the overall operating speed of the BiCMOS element can be greatly improved.

Referring to FIGS. 2–21, a first example of a manufacturing process of a semiconductor device according to the first embodiment will be described below.

Figure 2:
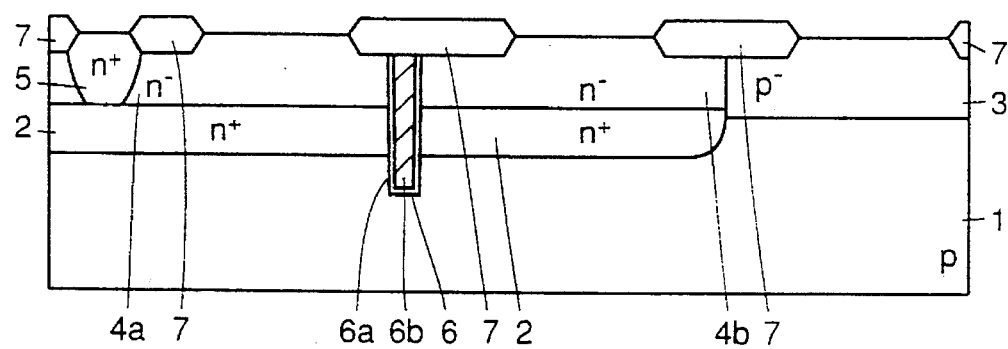
FIGS. 2–21 are sectional views showing 1st through 20th steps of a first example of a manufacturing process of a semiconductor device according to the first embodiment shown in FIG. 1.

As shown in FIG. 2, an n⁺ buried layer 2 is formed in a bipolar transistor formation region and a P channel MOS transistor formation region on a p type semiconductor substrate 1. After forming an n⁻ type epitaxial layer (not shown) on the entire surface thereof, an element isolation trench 6 is formed in the boundary region between the formation regions of the bipolar transistor and the P channel MOS transistor. An insulating film 6a is formed along the surface of element isolation trench 6. A filling material 6b made of an insulating film or a polycrystalline silicon film is filled in a region surrounded by insulating film 6a. An element isolation insulating film 7 is formed at a predetermined region on the surface of the n⁻ epitaxial layer by the LOCOS method. An n⁺ collector extraction layer 5 is formed in a collector electrode formation region of the bipolar transistor. A p⁻ layer 3 is formed by ion-implanting p type impurity into the N channel MOS transistor formation region.

Figure 3:
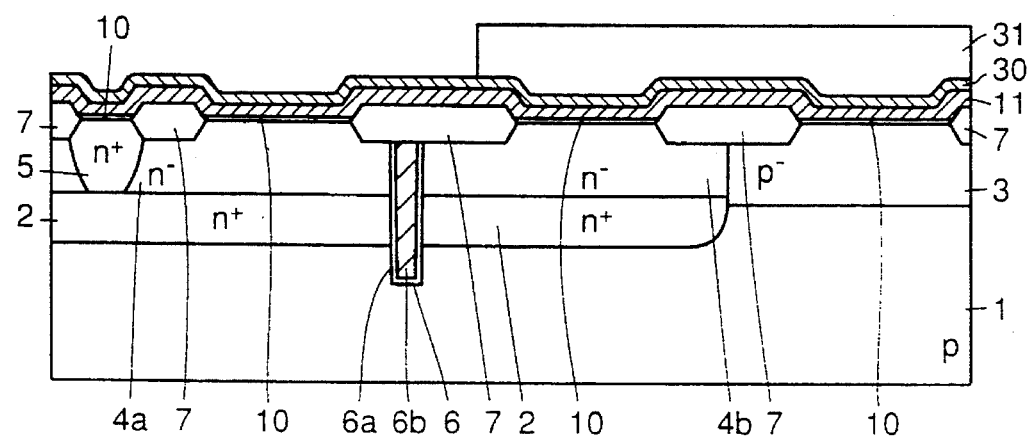
Figure 4:
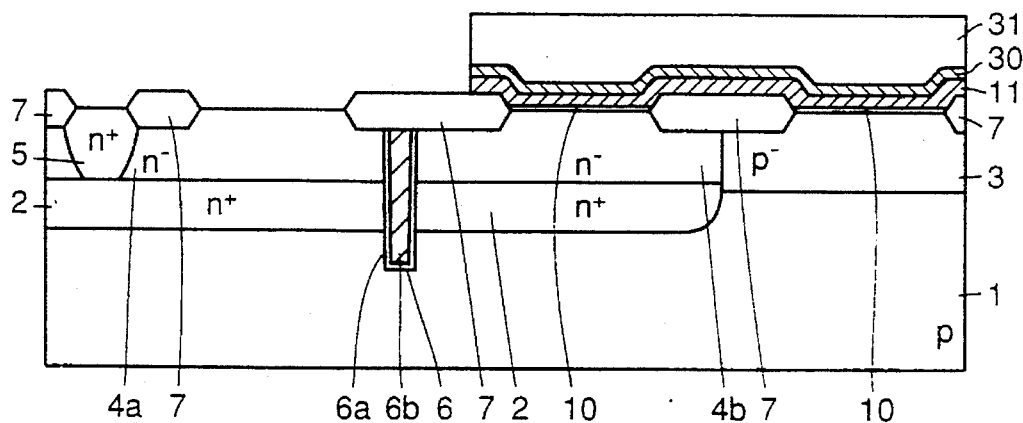

As shown in FIG. 3, oxidation is carried out on the entire surface to form a gate oxide film 10 to have a thickness of about 80–200 Å. A polycrystalline silicon film 11 having n type impurity doped thereinto is formed to have a thickness of about 1000–3000 Å on gate oxide film 10 and element isolation insulating film 7 by the CVD method. A nitride film 30 having a thickness of about 1000 Å is formed on polycrystalline silicon film 11. A resist 31 is formed at a predetermined region on nitride film 30. Nitride film 30 and polycrystalline silicon film 11 are patterned as shown in FIG. 4 by etching using resist 31 as a mask. Resist 31 is then removed.

Figure 5:
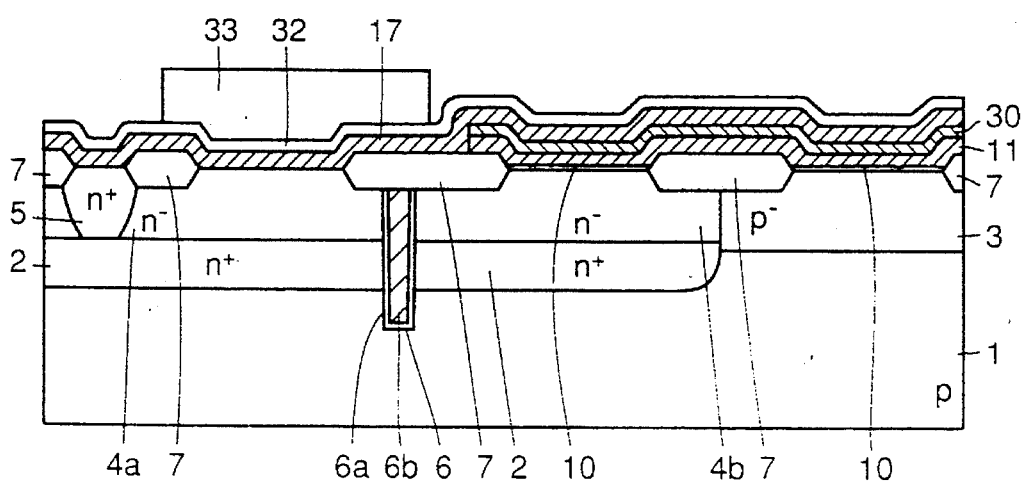
Figure 6:
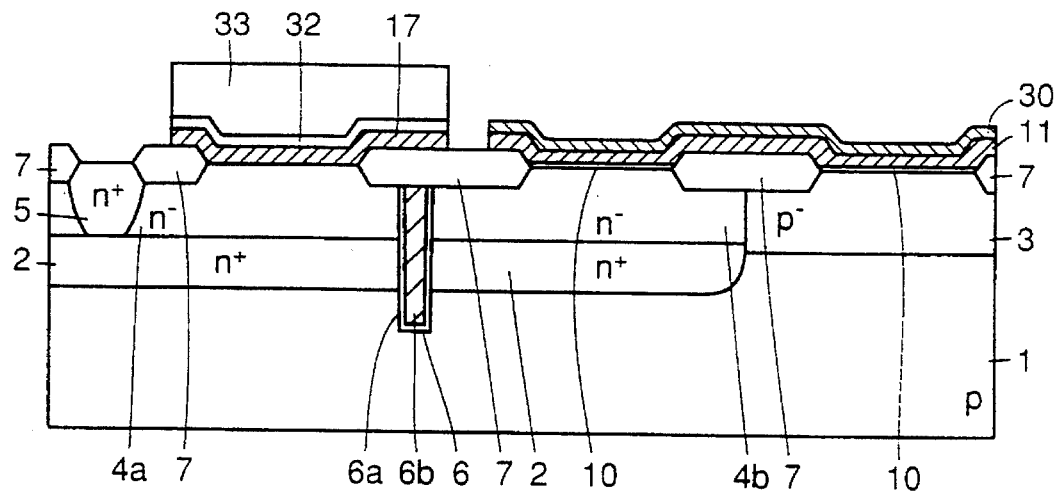

As shown in FIG. 5, a polycrystalline silicon film 17 having no impurity doped thereinto is formed on the entire surface to have a thickness of about 1000–3000 Å by the CVD method. An oxide film 32 having a thickness of about 1000 Å is formed on polycrystalline silicon film 17. A resist 33 is formed at a predetermined region on oxide film 32. Oxide film 32 and polycrystalline silicon film 17 are subjected to anisotropic etching using resist 33 as a mask. Thus, polycrystalline silicon film 17 and oxide film 32 patterned as shown in FIG. 6 can be obtained.

In this manufacturing method, gate oxide film 10 is covered by polycrystalline silicon film 11 and nitride film 30 when anisotropically etching oxide film 32 and polycrystalline silicon film 17. Therefore, oxide film 10 is not so much damaged as before during etching of oxide film 32 and polycrystalline silicon film 17. As a result, leakage of the current from the gate electrode to the channel region through gate oxide film 10 can be effectively prevented after completion of the P channel and the N channel MOS transistors. After anisotropic etching of oxide film 32 and polycrystalline silicon film 17 as described above, resist 33 is removed.

Figure 7:
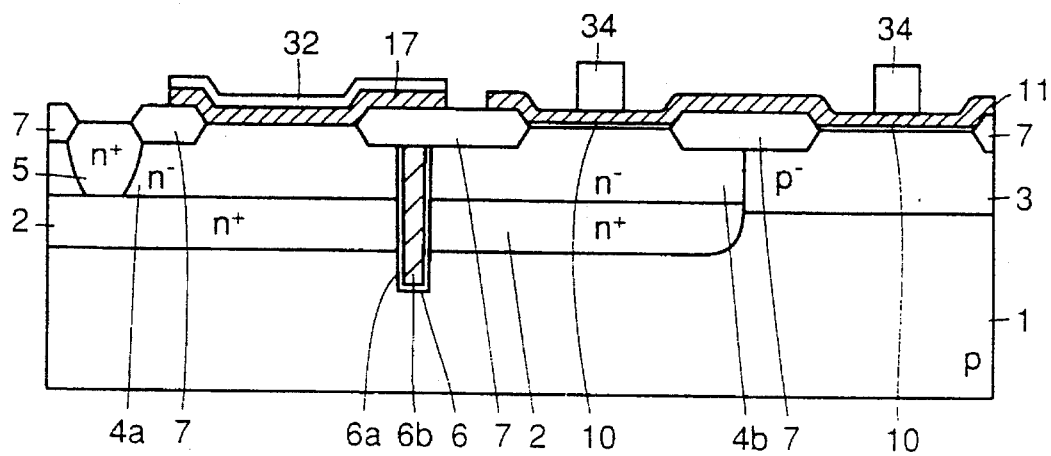
Figure 8:
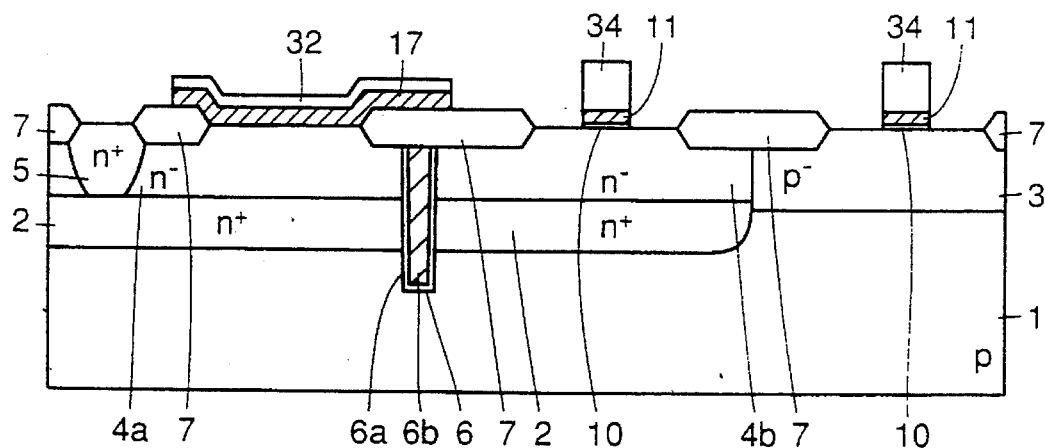

Nitride film 30 is removed by wet etching using hot phosphoric acid. Then, as shown in FIG. 7, a resist 34 is formed at a predetermined region on polycrystalline silicon film 11. Polycrystalline silicon film and gate oxide film 10 are anisotropically etched using resist 34 as a mask, as shown in FIG. 8. Resist 34 is then removed.

Figure 9:
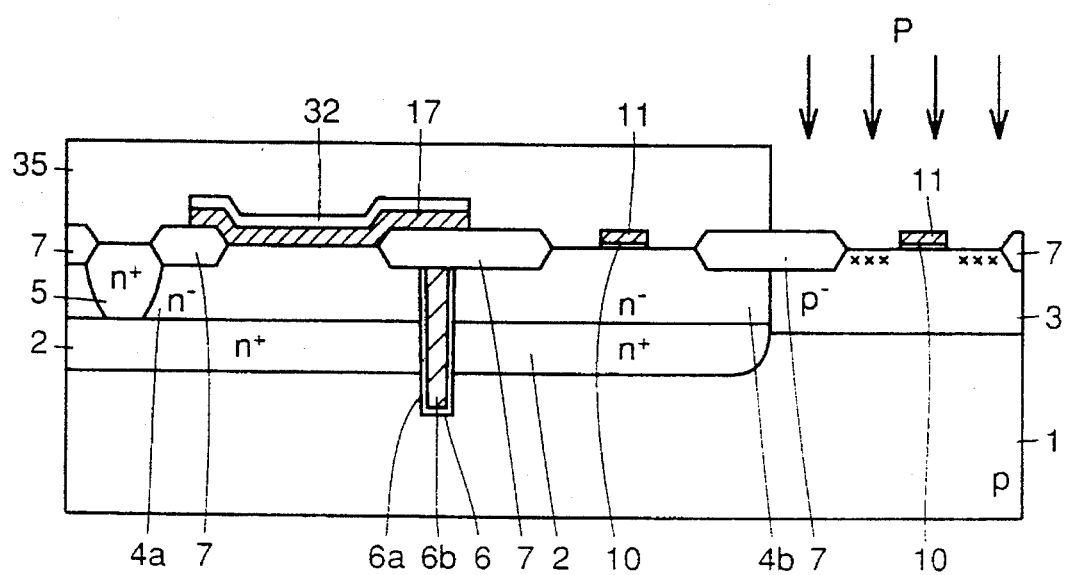

As shown in FIG. 9, a resist 35 is formed to cover regions other than N channel MOS transistor formation region. Using resist 35 as a mask, phosphorus (P) is ion-implanted into the N channel MOS transistor formation region with an implantation energy of about 100 KeV at a dosage of not more than $1\times10^{14}/cm^2$. Resist 35 is then removed.

Figure 10:
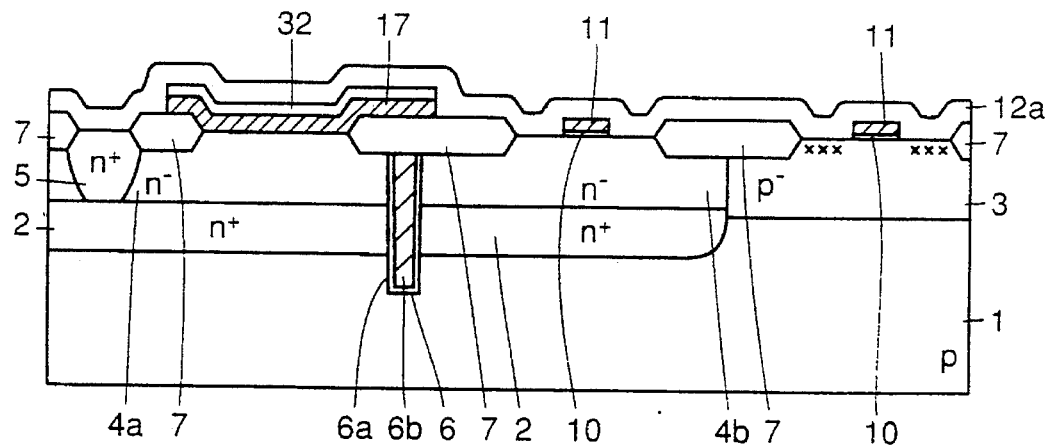
Figure 11:
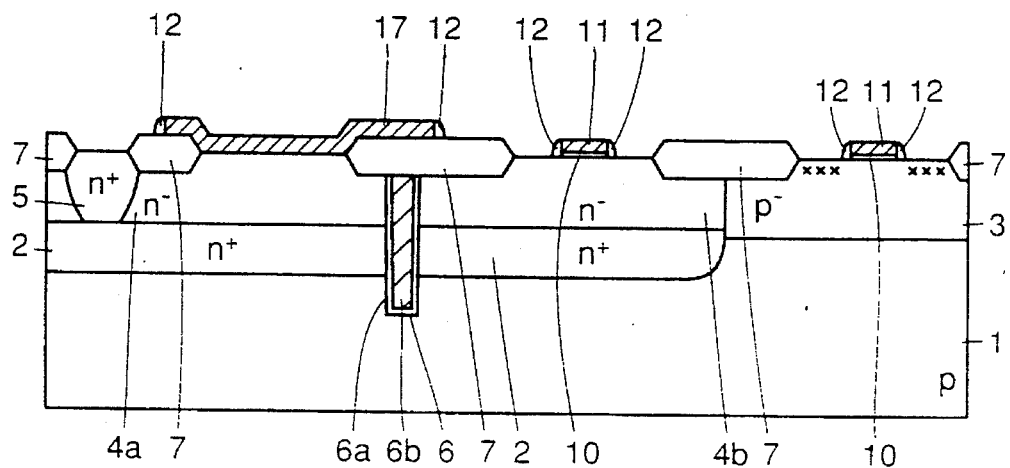

As shown in FIG. 10, after formation of an oxide film 12a on the entire surface by the CVD method, the entire surface of the oxide film 12a is anisotropically etched. Thus, a sidewall insulating film 12 is formed as shown in FIG. 11.

Figure 12:
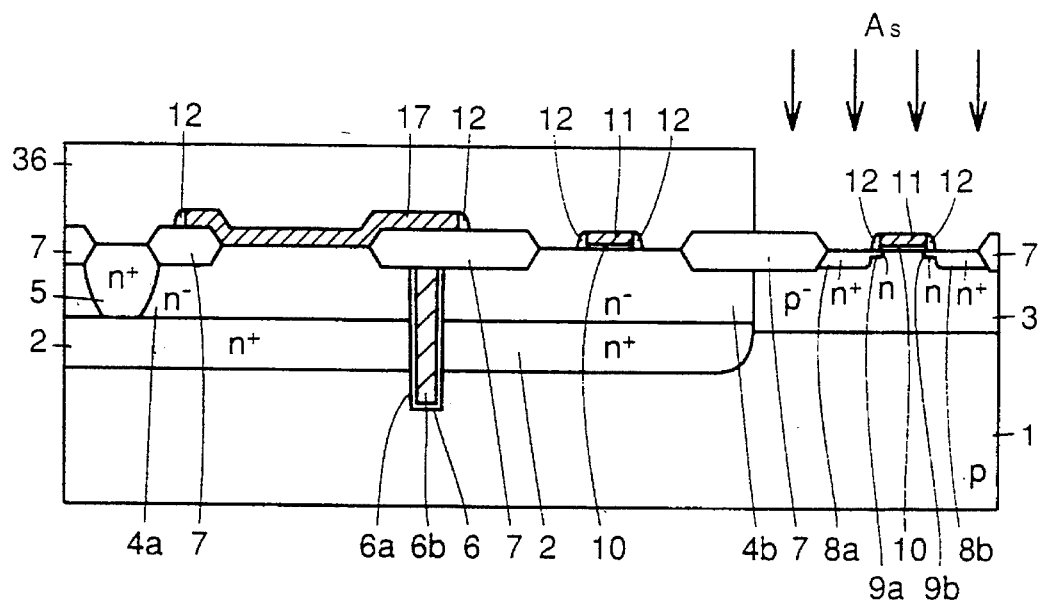

As shown in FIG. 12, a resist 36 is formed to cover regions other than N channel MOS transistor formation region. Using resist 36 as a mask, arsenic (As) is ion-implanted with an implantation energy of 50 KeV at the dosage of $4\times10^{15}/cm^2$–$6\times10^{15}/cm^2$. Resist 36 is then removed. After that, heat treatment is carried out at a temperature of 850° C. –900° C. for 30 minutes to cause phosphorus and arsenic introduced into N channel MOS transistor formation region to be electrically activated. Whereby high concentration source/drain regions 8a, 8b and low concentration source/drain regions 9a, 9b are formed as shown in FIG. 12.

Figure 13:
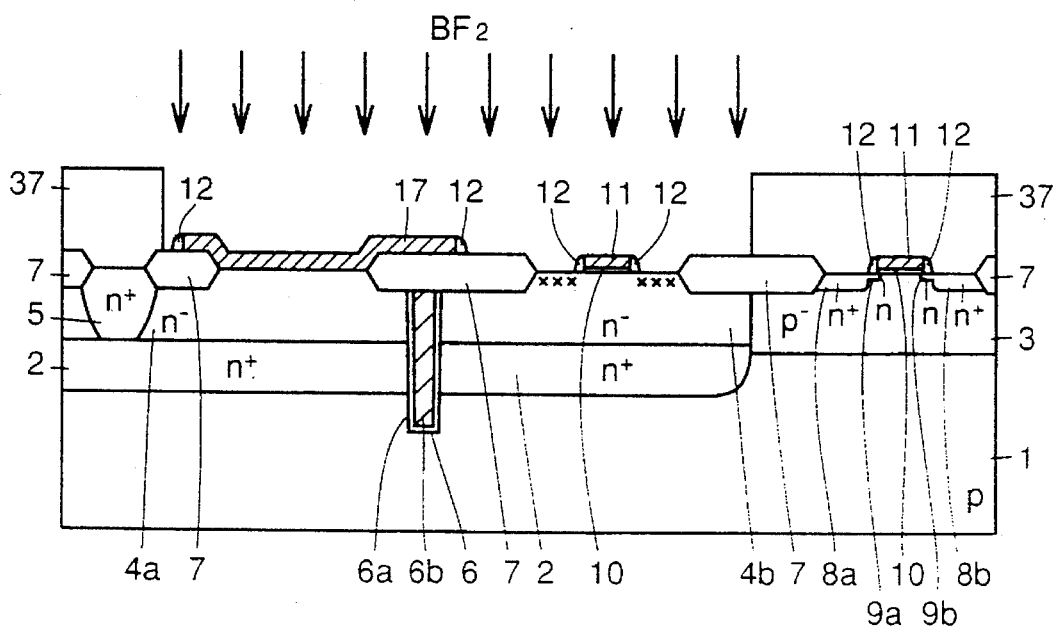

As shown in FIG. 13, a resist 37 is formed to cover regions other than the formation regions of the bipolar transistor and the P channel MOS transistor. Using resist 37 as a mask, B or $BF_2$ is ion-implanted into the source/drain formation regions and polycrystalline silicon film 17 with an implantation energy of 10–30 KeV at a dosage of $4\times10^{15}/cm^2$–$6\times10^{15}/cm^2$. Resist 37 is then removed.

Figure 14:
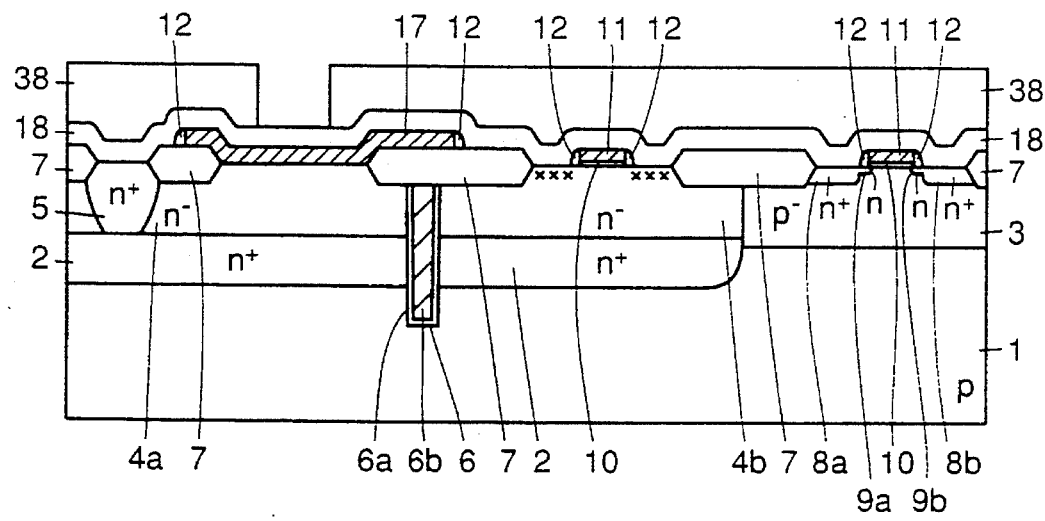
Figure 15:
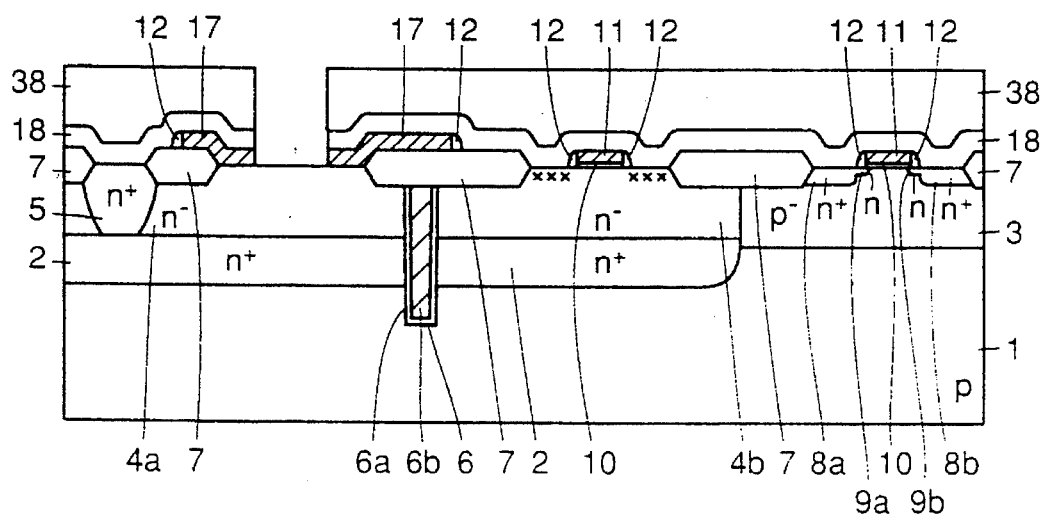

As shown in FIG. 14, an insulating film 18 made of a silicon oxide film is formed to have a thickness of about 2000–4000 Å by the CVD method so as to cover the entire surface. A resist 38 is formed at a predetermined region on insulating film 18. Insulating film 18 and polycrystalline silicon film 17 are anisotropically etched using resist 31 as a mask. Whereby a base extraction electrode layer 17 and insulating film 18 are formed as shown in FIG. 15. Resist 38 is then removed.

Figure 16:
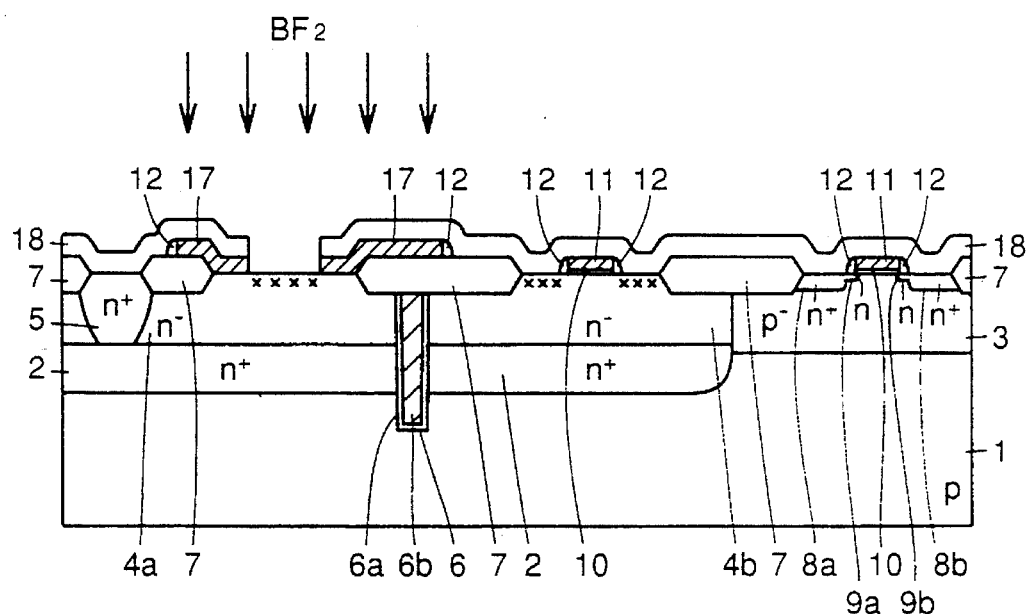

As shown in FIG. 16, $BF_2$ is ion-implanted into an intrinsic base layer formation region with an implantation energy of 15–30 KeV at a dosage of $4$–$8\times10^{13}/cm^2$, using insulating film 18 as a mask.

Figure 17:
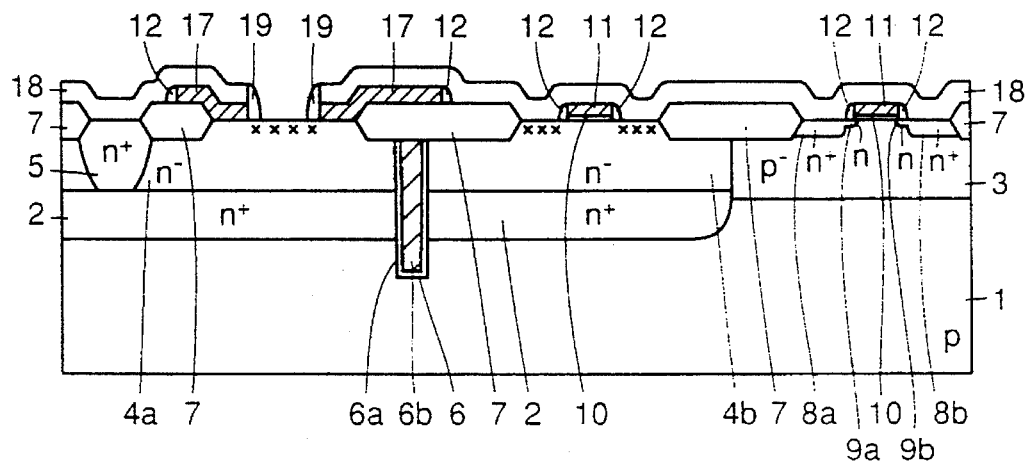
Figure 18:
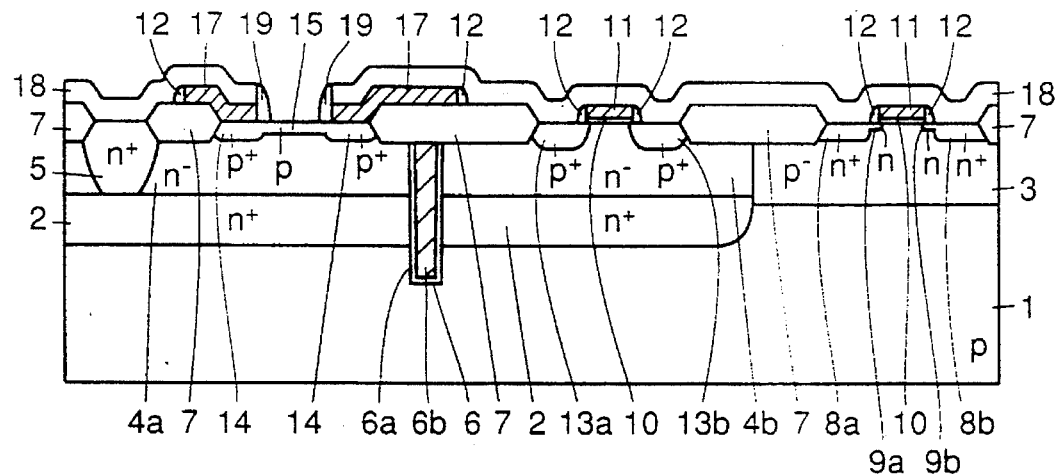

The oxide film (not shown) formed to cover the entire surface is anisotropically etched to form a sidewall insulating film 19 as shown in FIG. 17. After that, heat treatment is conducted at the temperature of 850° C. for 30 minutes, thus activating electrically impurities introduced into the region which becomes the intrinsic base layer and the regions which become the source/drain regions, and diffusing the impurity in base extraction electrode layer 17 into $n^-$ collector layer 4a. Whereby external base layer 14, an intrinsic base layer 15, and source/drain regions 13a, 13b of the P channel MOS transistor are formed as shown in FIG. 18. In the first example of the manufacturing process, external base layer 14 and source/drain regions 13a, 13b are formed in the same heat treatment. Also, source/drain regions 13a and 13b are formed by thermally diffusing the impurity ion-implanted onto the surface of $n^-$ layer 4b, while external base layer 14 is formed by diffusing the impurity in base extraction electrode layer 17 toward $n^-$ corrector layer 4a. Thus, the junction depth of external base layer 14 is naturally made shallower than the junction depth of source/drain regions 13a and 13b.

Ions are implanted into intrinsic base layer 15 at a low dosage to make the junction depth thereof shallower than that of external base layer 14. Therefore, according to the manufacturing method, external base layer 14 and intrinsic base layer 15 which have the junction depths shallower than the junction depth of source/drain regions 13a and 13b can be easily formed. Whereby the junction area between the external base and the collector is made smaller than before, resulting in the decreased junction capacitance. At the same time, the distance between external base layer 14/intrinsic base layer 15 and $n^+$ buried layer 2 is made larger. Therefore, the width of depletion layer located between external base layer 14/intrinsic base layer 15 and $n^+$ buried layer 2 is made wider, resulting in the decreased capacitance thereof. Consequently, the junction capacitance between the external base and the collector and the capacitance between the external base and $n^+$ buried layer can be reduced in the bipolar transistor portion, so that the operating speed of the bipolar transistor can be improved. Further, the junction depth of source/drain regions 13a and 13b of the P channel MOS transistor can be made deeper to a certain extent to increase the driving current, resulting in increase of the operation speed of the P channel MOS transistor. Consequently, the element which allows high-speed operation can be easily manufactured according to the manufacturing method.

Figure 19:
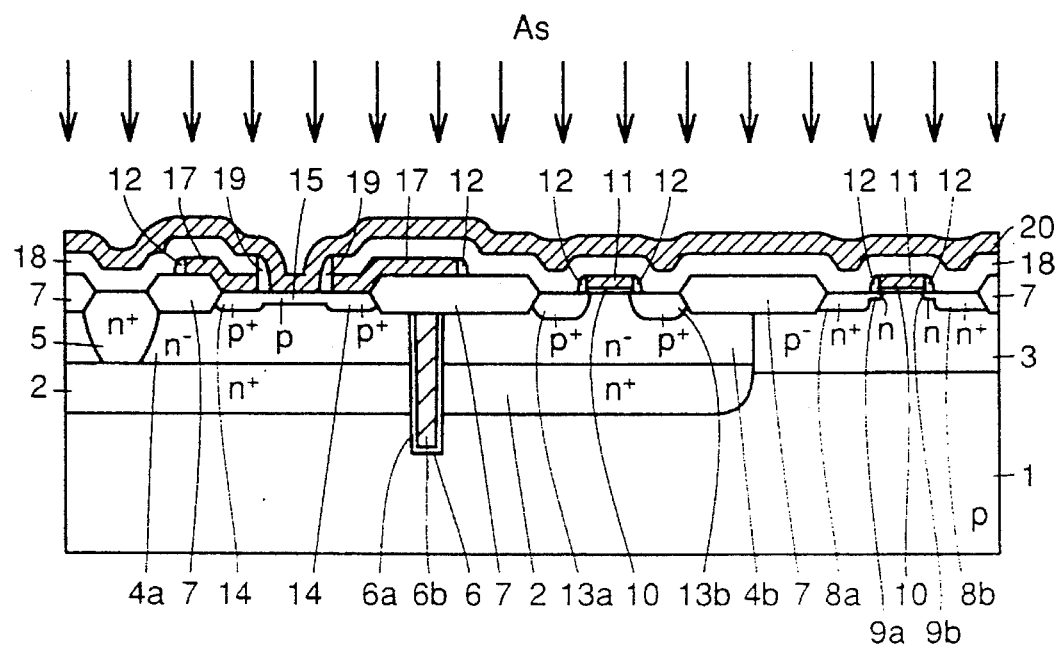
Figure 20:
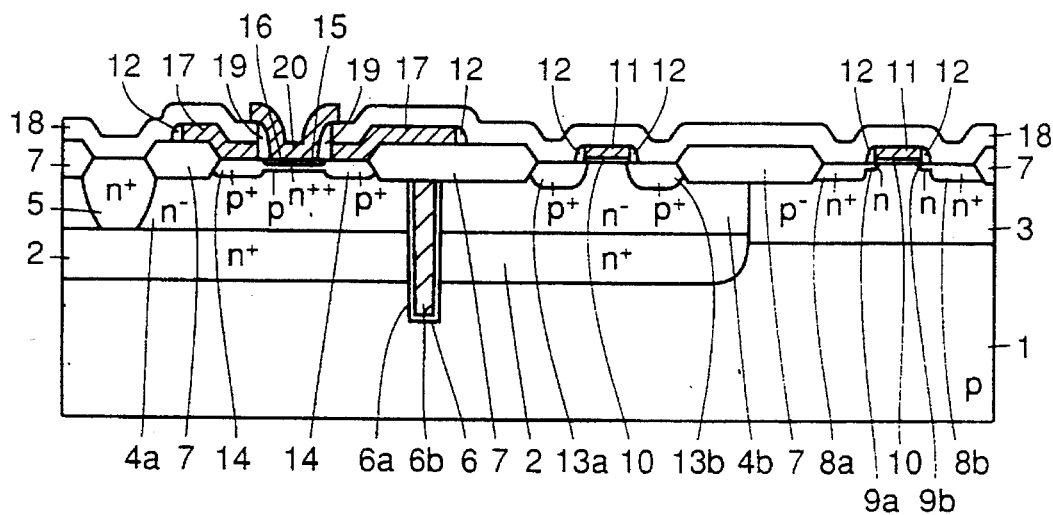

Next, as shown in FIG. 19, a polycrystalline silicon film 20 is formed by the CVD method to have a thickness of about 1000–3000 Å. Arsenic is ion-implanted into polycrystalline film 20. Polycrystalline film 20 is patterned to form an emitter electrode layer 20 made of a polycrystalline silicon film as shown in FIG. 20. Then, the impurity in emitter electrode layer 20 is diffused toward intrinsic base layer 15 by heat treatment to form an emitter layer 16.

Figure 21:
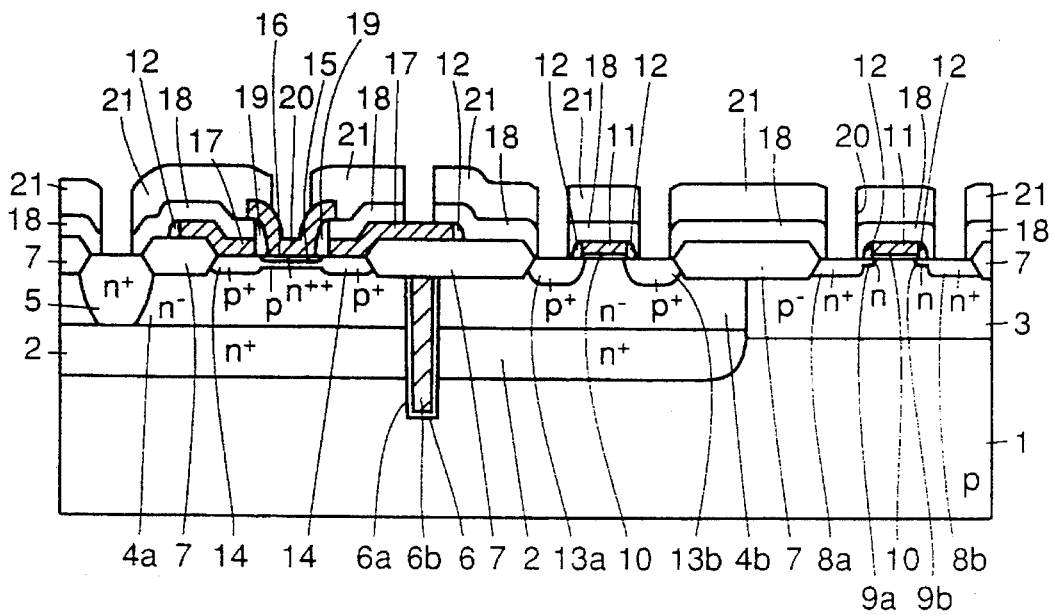

As shown in FIG. 21, an interlayer insulating film 21 is formed on the entire surface by the CVD method to have a thickness of about 10000 Å. A plurality of contact holes are formed in predetermined regions of interlayer insulating film 20 and insulating film 18.

Consequently, as shown in FIG. 1, an emitter interconnection layer 22, a base interconnection layer 23, a collector interconnection layer 24, source/drain interconnection layers 25, 26, and source/drain interconnection layers 27, 28 are respectively formed in the contact holes and on the upper surface of interlayer insulating film 21. The semiconductor device including the BiCMOS element according to the first embodiment is thus completed.

Figure 22:
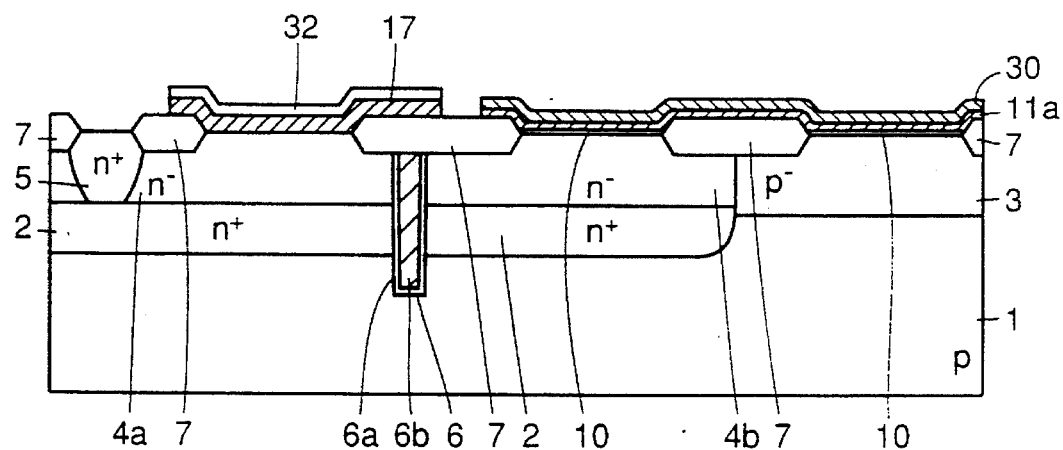
FIGS. 22–24 are sectional views showing 1st to 3rd steps of a second example of a manufacturing process of a semiconductor device according to the first embodiment shown in FIG. 1.
Figure 23:
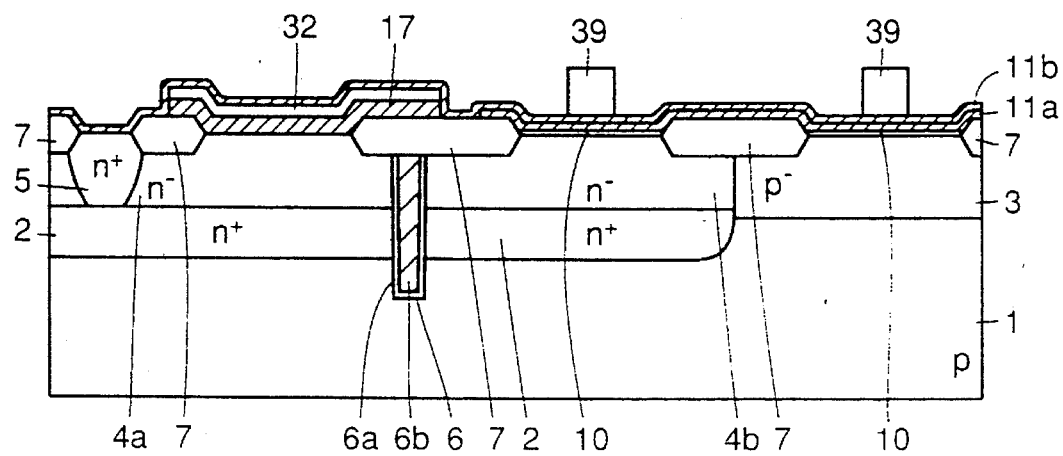
Figure 24:
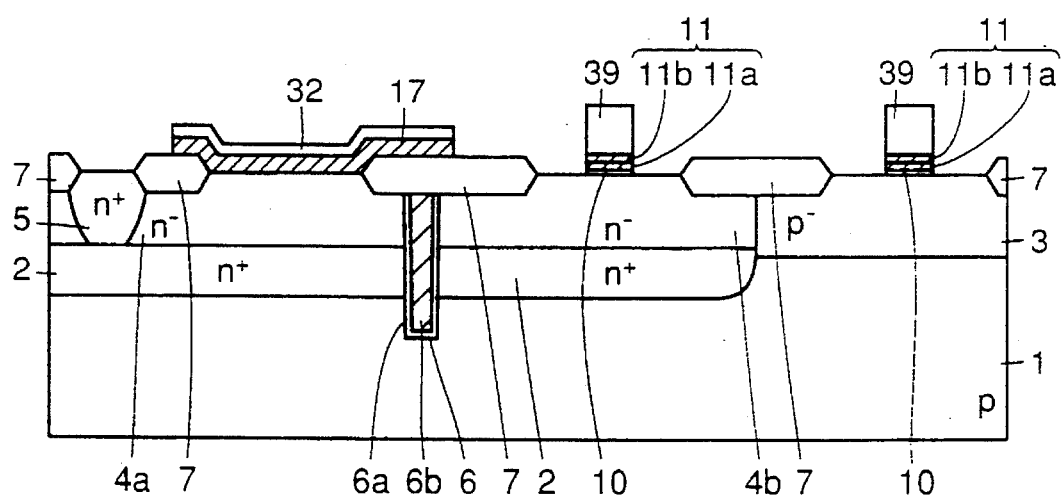

Referring to FIGS. 22–24, description will be made below on a second example of a manufacturing process of a semiconductor device according to the first embodiment.

First, the manufacturing process proceeds until an oxide film 32 is formed as shown in FIG. 22 by the same steps as in the first example shown in FIGS. 2–6. In the second example of the manufacturing process, a polycrystalline silicon film 11a is formed not to include impurity and a thickness thereof is about 500–1000 Å. After the step shown in FIG. 22, nitride film 30 is removed by wet fetching using hot phosphorous acid or the like. Since polycrystalline silicon film 11a located under nitride film 30 is formed not to include impurity in this example, the surface of polycrystalline film 11a can be effectively prevented from being etched during wet etching of nitride film 30 by hot phosphorous acid. In other words, etching of the surface of polycrystalline film 11a during wet etching of nitride film 30 can be prevented, because the polycrystalline silicon film not including impurity is hard to be etched compared with the polycrystalline silicon including impurity. Whereby the surface of polycrystalline silicon film 11a can be effectively prevented from becoming uneven.

After removing nitride film 30 as described above, a polycrystalline silicon film 11b having n type impurity doped thereinto is formed by CVD method to have a thickness of about 500–2000 Å, as shown in FIG. 23. A resist 39 is formed at a predetermined region on polycrystalline silicon film 11b. Using resist 39 as a mask, polycrystalline silicon films 11a and 11b are anisotropically etched to be patterned as shown in FIG. 24. Resist 39 is then removed. After that, heat treatment is carried out to diffuse the impurity introduced into polycrystalline silicon film 11b toward polycrystalline silicon film 11a. Thus, a gate electrode 11 made of polycrystalline silicon films 11a and 11b both including n type impurity can be formed. Then, the process continues through the same manufacturing steps as in the first example shown in FIGS. 9–21 for completing the semiconductor device according to the first embodiment as shown in FIG. 1.

Referring to FIGS. 25–30, a third example of the manufacturing process of the semiconductor device according to the first embodiment will be described below.

Figure 25:
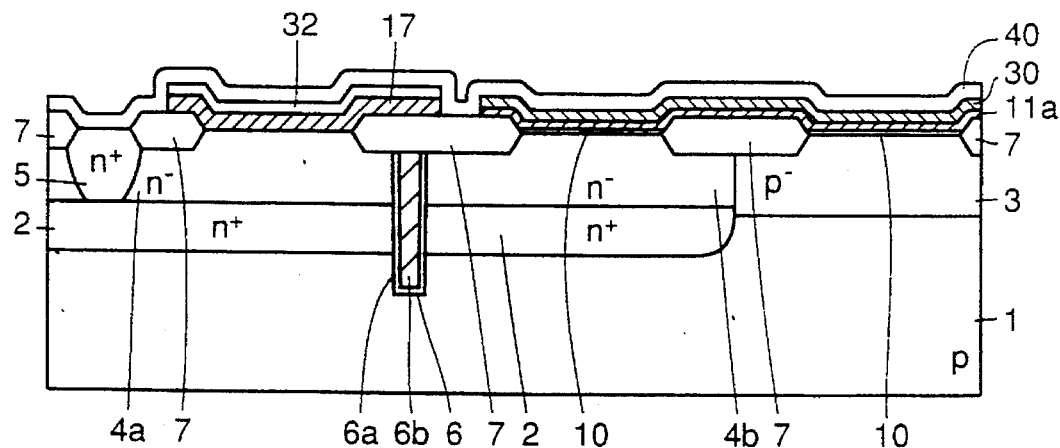
FIGS. 25–30 are sectional views showing 1st through 6th steps of a third example of a manufacturing process of a semiconductor device according to the first embodiment shown in FIG. 1.
Figure 26:
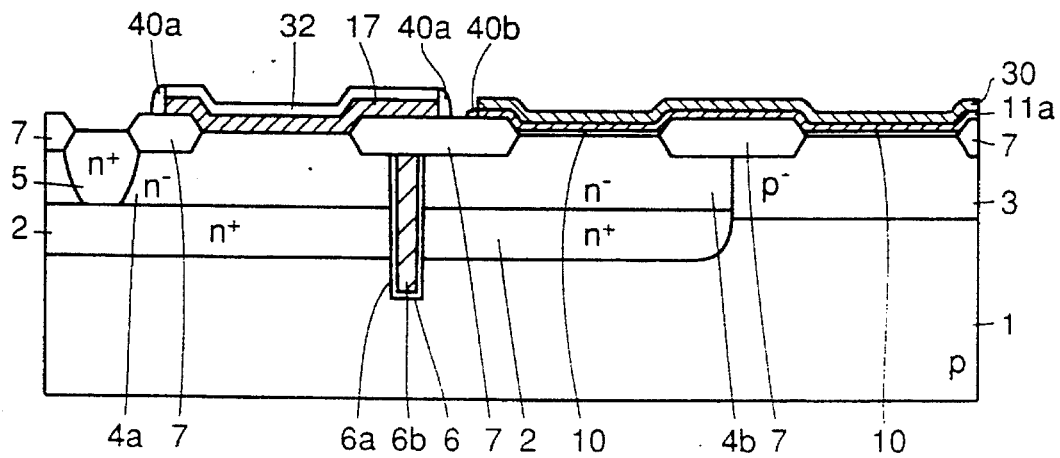

First, the process proceeds until nitride film 30 is formed by the same steps as in the second example shown in FIG. 22. Then, as shown in FIG. 25, an oxide film 40 is formed on the entire surface by the CVD method. Oxide film 40 is anisotropically etched to form sidewall insulating films 40a and 40b as shown in FIG. 26. Nitride film 30 is then removed by wet etching using hot phosphorous acid or the like.

In the third example, polycrystalline silicon film 11a is again formed not to include impurity as in the second example. Whereby etching of the surface of polycrystalline silicon film 11a can be effectively prevented at the time of wet etching of nitride film 30. As a result, the uneven surface of polycrystalline silicon film 11a can be prevented.

Figure 27:
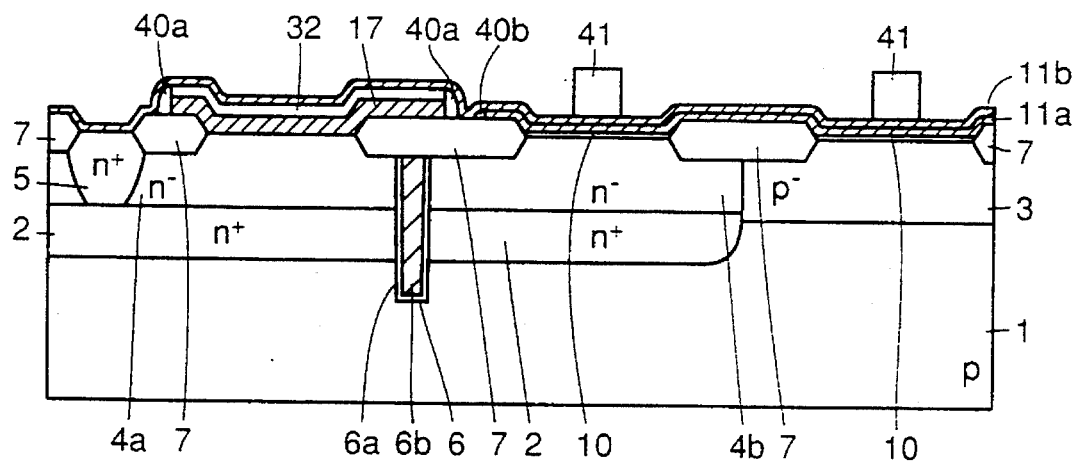
Figure 28:
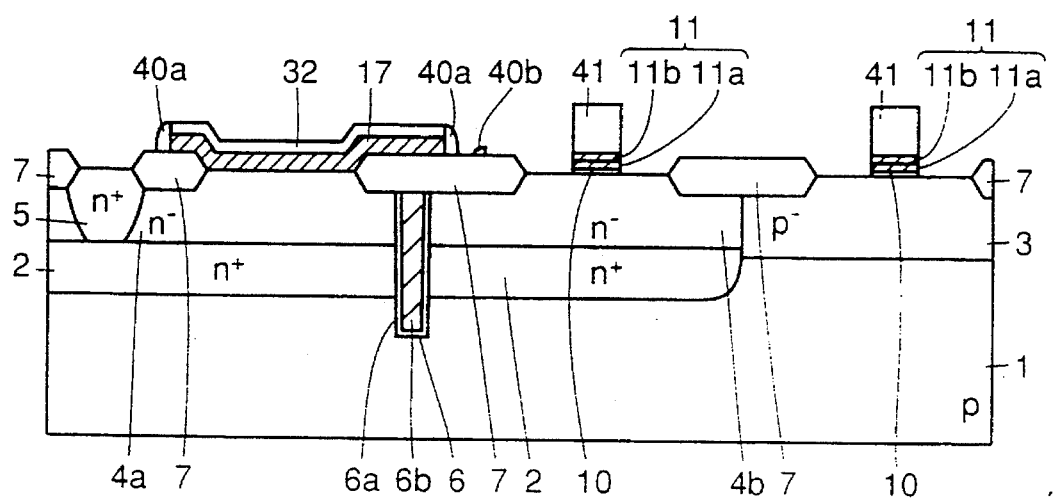

As shown in FIG. 27, polycrystalline silicon film 11b having n type impurity doped thereinto is formed on the entire surface by CVD method to have a thickness of about 500–2000 Å. A sidewall insulating film 40a is formed on the sidewall portion of polycrystalline silicon film 17 in this third example of the manufacturing process. Therefore when forming polycrystalline silicon film 11b having impurity doped thereinto, the polycrystalline silicon film 11b is not in contact with polycrystalline silicon film 17. Therefore, the n type impurity introduced within polycrystalline silicon film 11b is effectively prevented from entering polycrystalline silicon film 17. After that, a resist 41 is formed at a predetermined region on polycrystalline silicon film 11b. Using resist 41 as a mask, polycrystalline silicon films 11a and 11b are anisotropically etched to be patterned as shown in FIG. 28. During an anisotropical etching of polycrystalline silicon films 11a and 11b, since sidewall insulating film 40a is formed on the sidewall portion of polycrystalline silicon film 17, the side portion of polycrystalline silicon film 17 is ensured not to be etched. A sidewall insulating film 40b formed on the side portion of polycrystalline silicon film 11a remains after anisotropical etching of polycrystalline silicon films 11a and 11b. Resist 41 is then, removed.

Figure 29:
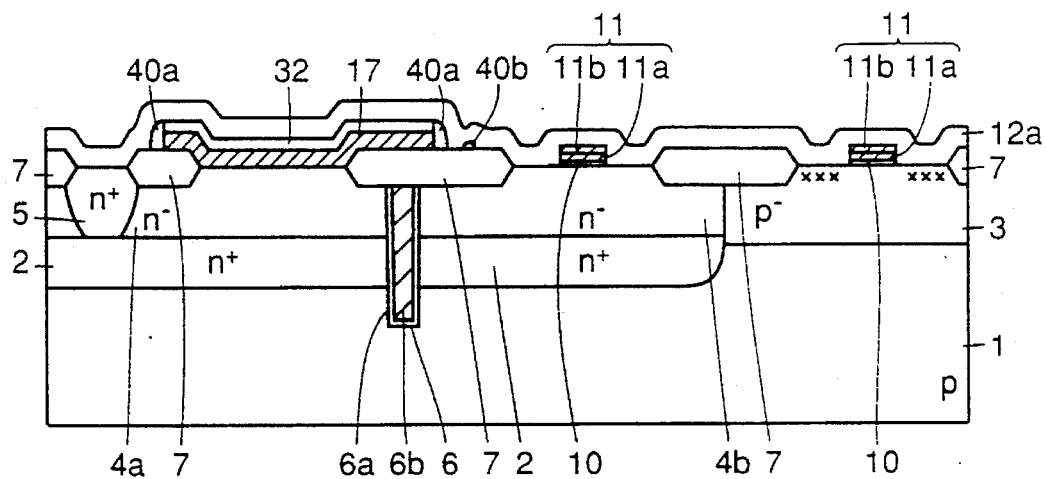
Figure 30:
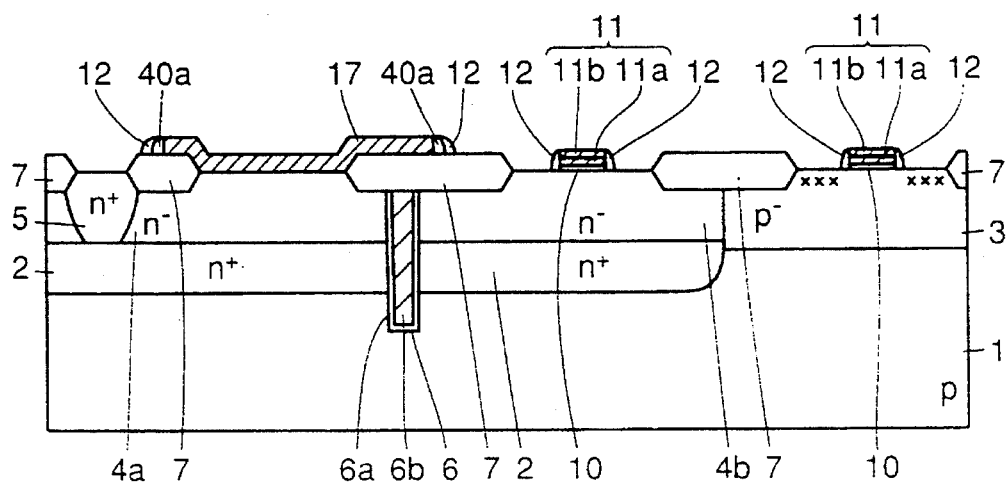

As shown in FIG. 29, an oxide film 12a formed on the entire surface is anisotropically etched. Thus, a sidewall insulating film 12 is formed as shown in FIG. 30. Consequently, the semiconductor device according to the first embodiment shown in FIG. 1 is completed by the same manufacturing steps as in the first example shown in FIGS. 12–21.

In this example an insulating film 40a is made by CVD oxide deposition and anisotropic etching, but an insulating 40a is possible to be made by thermal oxidation, too.

Figure 31:
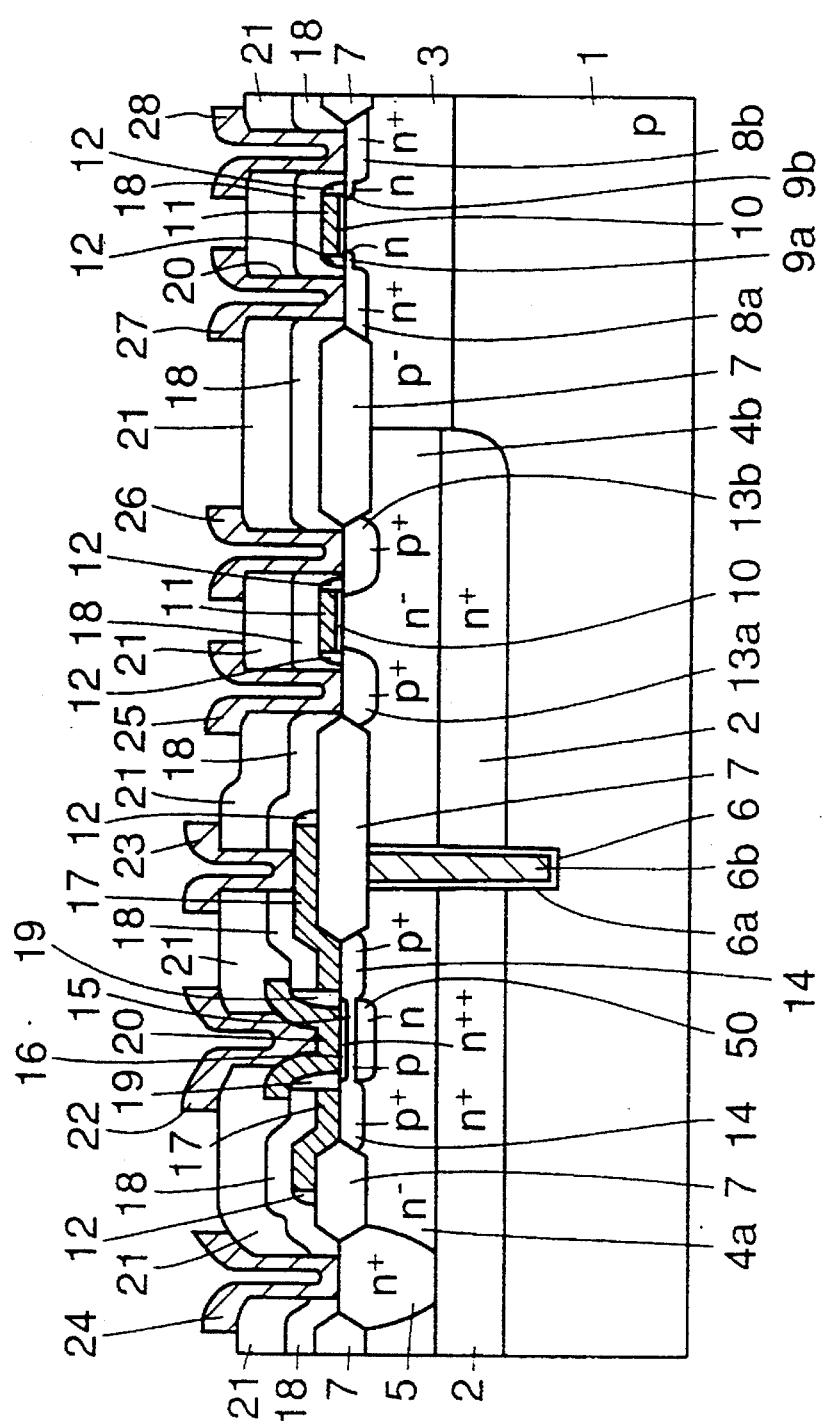
FIG. 31 is a sectional view showing a semiconductor device including a BiCMOS element according to a second embodiment of the present invention.

Now, FIG. 31 shows a semiconductor device according to a second embodiment in which junction depths of external base layer 14 and intrinsic base layer 15 are made shallower than the junction depth of source/drain regions 13a and 13b of the P channel MOS transistor, as in the structure of the first embodiment shown in FIG. 1. Further, an n type layer 50 is formed directly under p type intrinsic base layer 15 in the second embodiment. Thus, diffusion to the direction of the depth of intrinsic base layer 15 can be restrained when carrying out heat treatment for forming intrinsic base layer 15. As a result, intrinsic base layer 15 having a shallower junction depth can be formed. Accordingly, carrier's transit time to go across the intrinsic base layer 15 can be reduced. n type layer 50 is also provided to compensate the diffused impurities of the second conductivity type of the intrinsic base layer 15.

Figure 32:
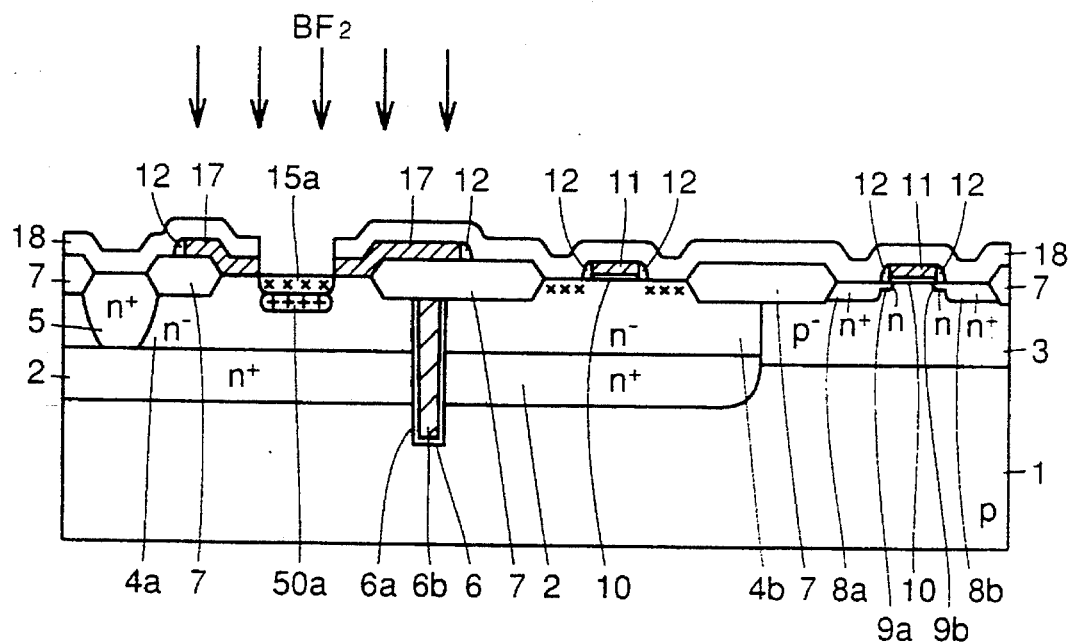
FIGS. 32–34 are sectional views showing 1st to 3rd steps of a manufacturing process of a semiconductor device according to the second embodiment shown in FIG. 31.
Figure 33:
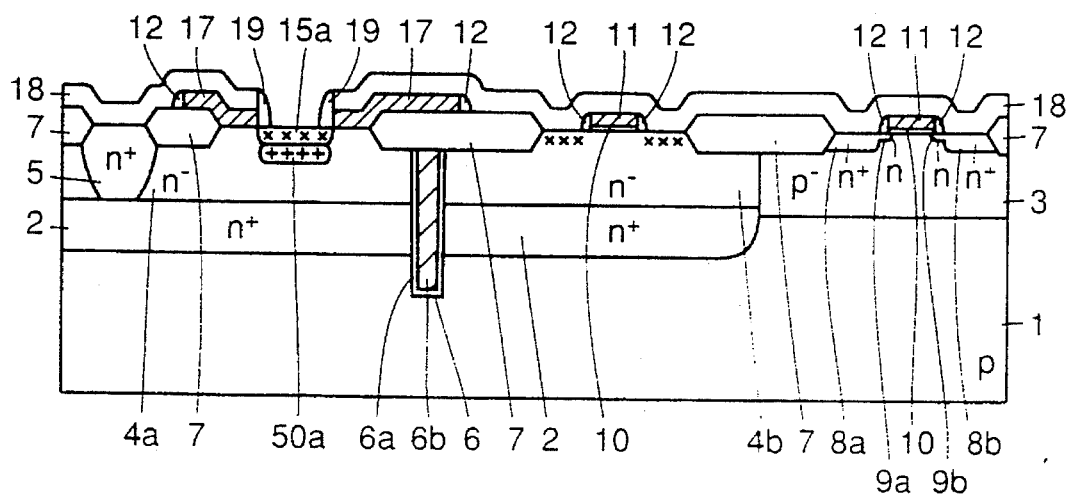
Figure 34:
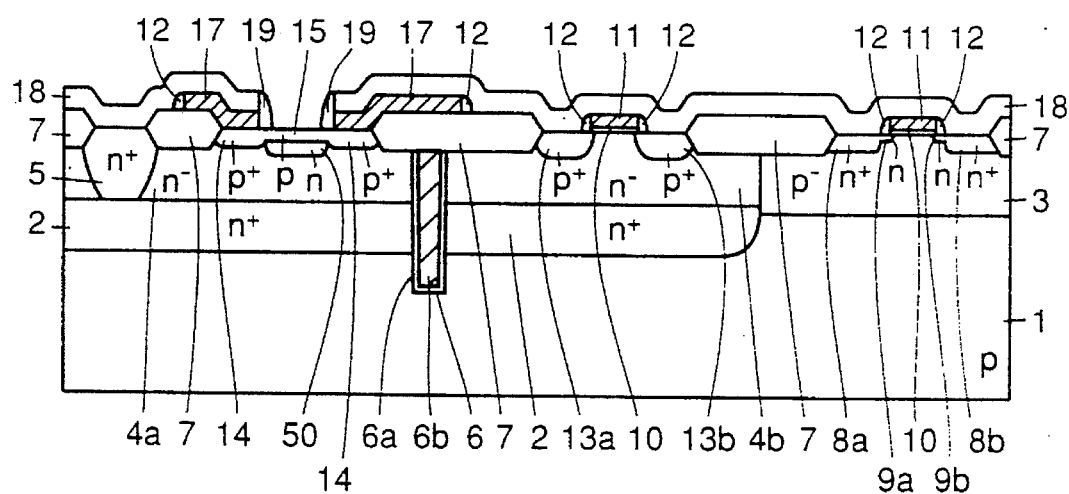

Referring to FIGS. 32–34, a manufacturing process of a semiconductor device according to the second embodiment will be described below.

First, the process proceeds until insulating film 18 is formed by the same manufacturing steps of the semiconductor device as in the first embodiment shown in FIGS. 2–15. Using insulating film 18 as a mask, phosphors (P) is ion-implanted with an implantation energy of about 120 KeV at a dosage of $1\times10^{13}$–$5\times10^{13}$/cm$^2$ to form an n type impurity-implanted layer 50a. Then, using insulating film 18 as a mask, BF$_2$ is ion-implanted with an implantation energy of 15–30 KeV at a dosage of $4\times10^{13}$–$8\times10^{13}$/cm$^2$ to form an intrinsic base implantation layer 15a.

Next, the oxide film (not shown) formed on the entire surface is anisotropically etched to form a sidewall insulating film 19 as shown in FIG. 33. After that, intrinsic base layer 15, n type layer 50, external base layer 14, source/drain regions 13a, 13b as shown in FIG. 34 are formed by heat treatment at a temperature of 850° C. for about 30 minutes. During the heat treatment, diffusion in the direction of depth of intrinsic base implantation layer 15a is restrained by n type impurity-implanted layer 50a. Thus, intrinsic base layer 15 having a shallower junction depth can be obtained. The semiconductor device according to the second embodiment is completed as shown in FIG. 31 by the same manufacturing steps of the semiconductor device shown in FIGS. 19–21 as in the first embodiment.

As described above, in a semiconductor device according to the present invention, by forming a second junction depth of an external base layer shallower than a first junction depth of source/drain regions, a junction area between an external base and a collector is decreased, and thus a junction capacitance between the external base layer and the collector layer can be reduced. Further, in addition to forming the second junction depth of the external base layer shallower than the first junction depth of source/drain regions, a third junction depth of an intrinsic base layer is made shallower than the first junction depth of source/drain regions, so that the distance between the intrinsic base layer/the external base layer and a buried collector layer can be increased. Therefore, a width of a depletion layer located between the intrinsic base layer/the external base layer and the buried collector layer can be wider, resulting in reduction of the capacitance thereof. Consequently, the decreased junction capacitance between the external base layer and the collector and the decreased capacitance between the external layer/ intrinsic base layer and the buried collector layer contribute to improvement of the operating speed of a bipolar transistor portion. On the other hand, the first junction depth of source/drain regions is made deeper than the second junction depth of the external base layer and than the third junction depth of the intrinsic base layer, thus increasing the driving current of a field effect transistor. This also contributes to improvement of the operating speed of the field effect transistor portion. If a buried layer of a second conductivity type is further formed under the intrinsic base layer, diffusion in the direction of depth of the intrinsic base layer can be restrained when carrying out heat treatment for forming the intrinsic base layer. Therefore, the intrinsic base layer having a still shallower junction depth can be formed to reduce thickness of the intrinsic base layer, resulting in reduction of carrier's transit time. Thereby, high-speed operation of the field effect transistor can be achieved.

In a method of manufacturing a semiconductor device according to the present invention, an external base electrode layer of a bipolar transistor is formed after formation of a gate electrode layer of a field effect transistor, so that a gate insulating layer located under the gate electrode layer is not damaged at the time of etching for patterning the external base electrode layer. Whereby a leak current is effectively prevented from flowing in a channel region through the gate insulating layer from the gate electrode. Further, impurity ion-implanted into regions serving as source/drain regions is electrically activated and impurity introduced into the external base electrode layer is diffused toward a region serving as the external base by the same heat treatment, resulting in formation of the external base layer having the junction depth shallower than that of source/drain regions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a first semiconductor region and a second semiconductor region;
    a field effect transistor comprising:
    a pair of source/drain regions of a second conductivity type formed in said first semiconductor region, said pair of source/drain regions having a first junction depth and spaced apart to define a channel region therebetween; and
    a gate electrode formed on said channel region with an insulating layer therebetween;
    a bipolar transistor comprising:
    a collector region of a first conductivity type formed in said second semiconductor region;
    an external base region of the second conductivity type formed in said collector region and having a second junction depth;
    an internal base region of the second conductivity type contiguous with said external base region, formed in said collector region and having a third junction depth;
    an emitter legion of the first conductivity type formed in said internal base region;
    wherein said second junction depth and said third junction depth are shallower than said first junction depth.

2. The semiconductor device of claim 1,
    wherein said first junction depth is in the range of 300 to 500 nm,
    said second junction depth is in the range of 200 to 300 nm,
    said third junction depth is in the range of 100 to 200 nm.

3. The semiconductor device of claim 1, wherein said third junction depth is shallower than said second junction depth.

4. The semiconductor device of claim 1, wherein said bipolar junction transistor further comprises:
    a buried layer of the first conductivity type formed beneath and in contact with said internal base layer for compensating the diffused impurities of the second conductivity type of said internal base layer.

5. The semiconductor device of claim 1, wherein said bipolar junction transistor further comprises:
    a buried layer of the first conductivity type formed beneath and in contact with said internal base layer so as to define said third junction depth.

6. The semiconductor device of claim 1, wherein said bipolar junction transistor further comprises:
    a base electrode layer formed on the surface of said external base layer and in electrical contact with said external base layer, and
    an emitter electrode layer formed on the surface of said emitter layer and in electrical contact with said emitter layer.

7. The semiconductor device of claim 6, wherein said bipolar junction transistor further comprises:
    an interlayer insulating film interposed between said base electrode layer and said emitter electrode layer.

8. A semiconductor device comprising:
    a semiconductor substrate having first, second and third semiconductor regions;
    a second conductivity type field effect transistor including:
    a pair of source/drain regions of a second conductivity type formed in said first semiconductor region, said pair of source/drain regions having a first junction depth and spaced apart to define the channel region therebetween; and
    a gate electrode formed on said channel region with an insulating layer therebetween;
    a first conductivity type field effect transistor including:
    a pair of source/drain regions of a first conductivity type formed in said second semiconductor region, said pair of source/drain regions having a second junction depth and spaced apart to define a channel region therebetween; and
    a gate electrode formed on said channel region with an insulating layer therebetween; and
    a bipolar transistor including:
    a collector region of a first conductivity type formed in said third semiconductor region;
    an external base region of the second conductivity type formed in said collector region and having a third junction depth;
    an internal base region of the second conductivity type contiguous with said external base region, formed in said collector region and having a fourth junction depth; and
    an emitter region of the first conductivity type formed in said internal base region;
    wherein said third junction depth and said fourth junction depth are shallower than said first junction depth.

9. The semiconductor device of claim 8,
    wherein said first junction depth is in the range of 300 to 500 nm,
    said third junction depth is in the range of 200 to 300 nm,
    said fourth junction depth is in the range of 100 to 200 nm.

10. The semiconductor device of claim 8, wherein said fourth junction depth is shallower than said third junction depth.

* * * * *